United States Patent
Kanamura

(10) Patent No.: US 9,349,828 B2
(45) Date of Patent: May 24, 2016

(54) SEMICONDUCTOR DEVICE AND METHOD OF MANUFACTURING SEMICONDUCTOR DEVICE

(71) Applicant: FUJITSU LIMITED, Kawasaki-shi, Kanagawa (JP)

(72) Inventor: Masahito Kanamura, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/280,882

(22) Filed: May 19, 2014

(65) Prior Publication Data

US 2014/0346526 A1    Nov. 27, 2014

(30) Foreign Application Priority Data

May 27, 2013    (JP) .................................. 2013-111266

(51) Int. Cl.
| | | |
|---|---|---|
| *H01L 29/66* | (2006.01) | |
| *H01L 29/51* | (2006.01) | |
| *H01L 29/778* | (2006.01) | |
| *H01L 21/28* | (2006.01) | |
| *H01L 29/20* | (2006.01) | |
| *H01L 29/417* | (2006.01) | |
| *H01L 29/423* | (2006.01) | |

(52) U.S. Cl.
CPC .... *H01L 29/66462* (2013.01); *H01L 21/28264* (2013.01); *H01L 29/513* (2013.01); *H01L 29/7786* (2013.01); *H01L 29/2003* (2013.01); *H01L 29/41766* (2013.01); *H01L 29/4236* (2013.01); *H01L 29/517* (2013.01)

(58) Field of Classification Search
CPC ...................... H01L 21/02458; H01L 29/2003; H01L 29/1054
USPC ...................................... 257/76, 194; 438/285
See application file for complete search history.

(56) References Cited

U.S. PATENT DOCUMENTS

| | | | | |
|---|---|---|---|---|
| 6,808,972 | B2 * | 10/2004 | Sirringhaus et al. | .......... 438/200 |
| 7,679,079 | B1 * | 3/2010 | Marks | ................... H01L 51/052 |
| | | | | 257/24 |
| 2006/0157733 | A1 * | 7/2006 | Lucovsky et al. | ............. 257/192 |
| 2007/0105374 | A1 * | 5/2007 | Lee | ................... H01L 21/28185 |
| | | | | 438/681 |
| 2010/0213470 | A1 * | 8/2010 | Yamazaki et al. | ............... 257/77 |
| 2010/0320437 | A1 * | 12/2010 | Gordon | ................. B82Y 10/00 |
| | | | | 257/9 |
| 2011/0068372 | A1 * | 3/2011 | Ren et al. | ....................... 257/194 |
| 2014/0346442 | A1 * | 11/2014 | Nag et al. | ........................ 257/29 |

FOREIGN PATENT DOCUMENTS

| | | |
|---|---|---|
| JP | 2002-359256 A1 | 12/2002 |
| JP | 2010-199481 A1 | 9/2010 |
| JP | 2011-14789 A1 | 1/2011 |

* cited by examiner

*Primary Examiner* — Douglas Menz
*Assistant Examiner* — Neil Prasad
(74) *Attorney, Agent, or Firm* — Kratz, Quintos & Hanson, LLP

(57) ABSTRACT

A semiconductor device includes a first semiconductor layer formed of a nitride semiconductor on a substrate; a second semiconductor layer formed of a nitride semiconductor on the first semiconductor layer; an insulating layer formed on the second semiconductor layer; a source electrode and a drain electrode formed on the second semiconductor layer; and a gate electrode formed on the insulating layer. The insulating layer is formed of a material including an oxide and is formed by laminating a first insulating layer and a second insulating layer in a positioning order of the first insulating layer followed by the second insulating layer from a side of the second semiconductor layer, and an amount of hydroxyl groups included in per unit volume of the first insulating layer is less than an amount of hydroxyl groups included in per unit volume of the second insulating layer.

20 Claims, 25 Drawing Sheets

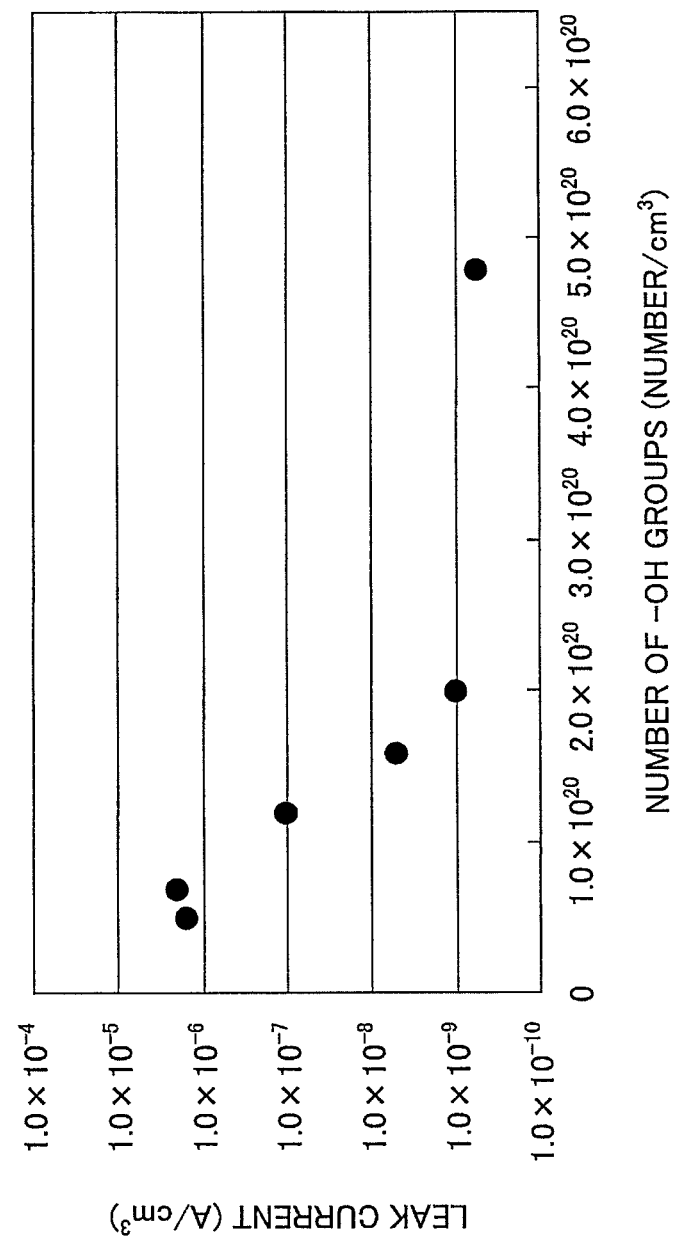

H₂O thermal desorption from ALD-Al₂O₃

AlOH dehydration: 2Al-OH → Al-O-Al + H₂O

SEMICONDUCTOR DEVICE AND METHOD OF MANUFACTURING SEMICONDUCTOR DEVICE

CROSS-REFERENCE TO RELATED APPLICATION

This patent application is based upon and claims the benefit of priority of the prior Japanese Patent Application No. 2013-111266 filed on May 27, 2013, the entire contents of which are incorporated herein by reference.

FIELD

The embodiments discussed herein are related to a semiconductor device and a method of manufacturing a semiconductor device.

BACKGROUND

GaN, AlN, and InN, which are nitride semiconductors, or materials made of mixed crystals thereof, have a wide band gap, and are used as high output electronic devices or short-wavelength light emitting devices. For example, GaN that is a nitride semiconductor has a band gap of 3.4 eV, which is wider than the band gap 1.1 eV of Si and the band gap 1.4 eV of GaAs.

As such a high output device, there is a Field effect transistor (FET), more particularly, a High Electron Mobility Transistor (HEMT) (see, for example, Patent Document 1). A HEMT using such a nitride semiconductor is used for high output/high efficiency amplifiers and high power switching devices. Specifically, in a HEMT using AlGaN as the electron supply layer and GaN as the electron transit layer, piezoelectric polarization occurs in AlGaN due to strains caused by the difference in lattice constants between AlGaN and GaN, and high-density two-dimensional electron gas (2DEG) is generated. Thus, operations at high voltage are possible, and the HEMT may be used for high-efficiency switching elements and high breakdown voltage electric devices in electric vehicles, etc.

The 2DEG generated as described above is usually in a region immediately below the gate, even in a state where voltage is not applied to the gate electrode, etc., and therefore the fabricated device becomes normally-on. However, it is generally desired that a power switching element, etc., is normally-off; that is to say, when the gate voltage is 0 V, it is desired that there is no current flowing between the drain-source. Therefore, various structures and methods have been studied to make the device become normally-off (for example, Patent Document 2). Furthermore, in order to suppress a leak current in a transistor such as HEMT, there is disclosed a device having an insulating gate structure in which an insulating film is formed under the gate electrode (for example, Patent Document 3).

Patent document 1: Japanese Laid-Open Patent Publication No. 2002-359256
Patent document 2: Japanese Laid-Open Patent Publication No. 2011-14789
Patent document 3: Japanese Laid-Open Patent Publication No. 2010-199481

Incidentally, in a HEMT using a nitride semiconductor having a structure in which an insulating film is formed under the gate electrode, the gate threshold voltage may become unstable, which is unfavorable as operation failures may be caused. Furthermore, in such a HEMT, the gate leak current is preferably low.

SUMMARY

According to an aspect of the embodiments, a semiconductor device includes a first semiconductor layer formed of a nitride semiconductor on a substrate; a second semiconductor layer formed of a nitride semiconductor on the first semiconductor layer; an insulating layer formed on the second semiconductor layer; a source electrode and a drain electrode formed on the second semiconductor layer; and a gate electrode formed on the insulating layer. The insulating layer is formed of a material including an oxide and is formed by laminating a first insulating layer and a second insulating layer in a positioning order of the first insulating layer followed by the second insulating layer from a side of the second semiconductor layer, and an amount of hydroxyl groups included in per unit volume of the first insulating layer is less than an amount of hydroxyl groups included in per unit volume of the second insulating layer.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 6 is a correlation diagram of the number of —OH groups and a leak current in an insulating film;

DESCRIPTION OF EMBODIMENTS

Figure 1:
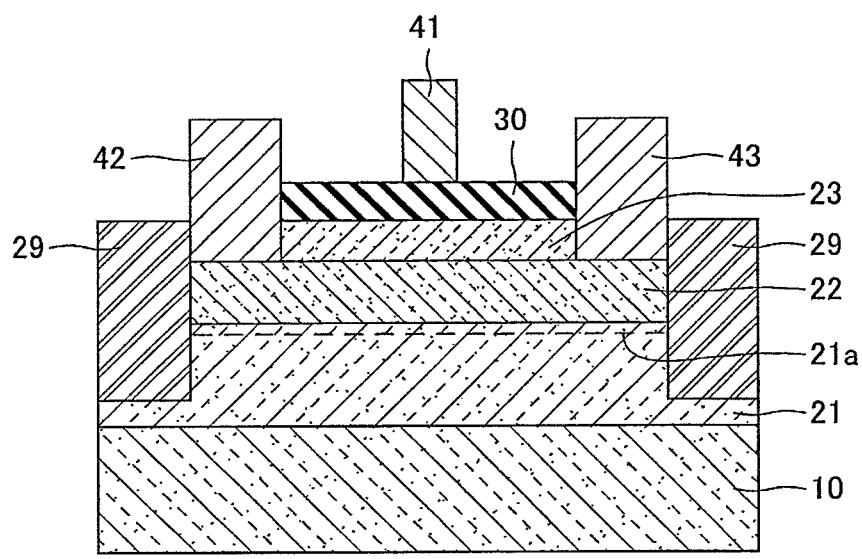
FIG. 1 is a structure diagram of a conventional semiconductor device.

Embodiments are explained below. Note that the same members, etc., are denoted by the same reference numerals and redundant descriptions are omitted.

First Embodiment

Figure 2:
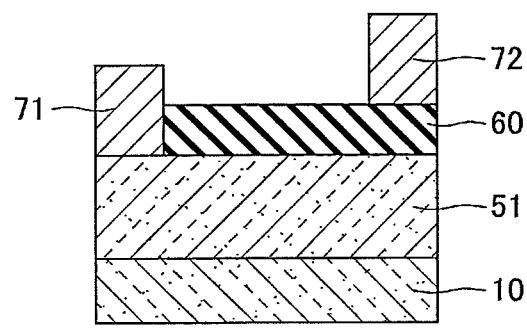
FIG. 2 is a structure diagram of a C-V measurement sample.

First, with regard to a semiconductor device having the structure illustrated in FIG. 1, which is a HEMT using a nitride semiconductor having a structure in which an insulating film is formed under the gate electrode, the factor causing the gate threshold voltage to become unstable has been studied by fabricating a C-V measurement sample having the structure illustrated in FIG. 2.

The semiconductor device having the structure of FIG. 1 has an electron transit layer 21, an electron supply layer 22, and a cap layer 23 laminated on a substrate 10 and made of nitride semiconductors. Furthermore, on part of the electron transit layer 21, the electron supply layer 22, and the cap layer 23, an element separation area 29 is formed for separating elements. On the cap layer 23, an insulating layer 30, a source electrode 42, and a drain electrode 43 are formed, and a gate electrode 41 is formed on the insulating layer 30. Note that on the substrate 10, a buffer layer may be formed according to need, in which case the nitride semiconductor layers described above are formed on the buffer layer.

The method of manufacturing the semiconductor device having the above structure includes, first sequentially laminating a buffer layer (not illustrated), the electron transit layer 21, the electron supply layer 22, and the cap layer 23 on the substrate 10 by MOVPE (Metal Organic Vapor Phase Epitaxy). The electron transit layer 21 is formed of i-GaN having a thickness of 3 µm, and the electron supply layer 22 is formed of i-$Al_{0.25}Ga_{0.75}N$ having a thickness of 20 nm. The cap layer 23 is formed of n-GaN having a thickness of 5 nm, and Si of $1\times10^{18}/cm^3$ is doped in the cap layer 23 as an n-type impurity element. Accordingly, at the part of the electron transit layer 21 near the interface between the electron transit layer 21 and the electron supply layer 22, 2DEG 21a is generated.

Next, a photoresist is applied on the cap layer 23, and by performing exposing and developing with an exposing device, a resist pattern (not illustrated) is formed, having an opening part in an area where the element separation area 29 is to be formed. Subsequently, in part of the cap layer 23, the electron supply layer 22, and the electron transit layer 21 at the opening part of the resist pattern, by performing dry etching using chlorinated gas or by implanting ions such as Ar, the element separation area 29 is formed. Subsequently, the resist pattern (not illustrated) is removed.

Next, a photoresist is applied again on the cap layer 23, and by performing exposing and developing with an exposing device, a resist pattern (not illustrated) is formed, having an opening part in an area where the source electrode 42 and the drain electrode 43 are to be formed. Subsequently, the cap layer 23 at the opening part of the resist pattern is removed by RIE (Reactive Ion Etching), etc., and after exposing the electron supply layer 22, a resist pattern (not illustrated) is removed by an organic solvent, etc.

Next, a photoresist is applied again on the electron supply layer 22 and the cap layer 23, and by performing exposing and developing with an exposing device, a resist pattern (not illustrated) is formed, having an opening part in an area where the source electrode 42 and the drain electrode 43 are to be formed. Subsequently, by forming a metal film by vacuum deposition on the resist pattern and the electron supply layer 22 at the opening part, and dipping the metal film in an organic solvent, etc., the metal film formed on the resist pattern is removed by being lifted off together with the resist pattern. Accordingly, by the metal film remaining at the opening part of the resist pattern (not illustrated), the source electrode 42 and the drain electrode 43 are formed. At this time, the metal film that is formed is a metal laminated film of Ti/Al, which is made to have ohmic contact by subsequently performing a heat treatment at a temperature of approximately 700° C.

Next, on the cap layer 23, by performing ALD (Atomic Layer Deposition) under a condition of a substrate temperature of 350° C., the insulating layer 30 is formed, which is constituted by $Al_2O_3$ having a thickness of approximately 40 nm. Subsequently, on the insulating layer 30, the source electrode 42, and the drain electrode 43, a photoresist is applied, and by performing exposing and developing with an exposing device, a resist pattern (not illustrated) is formed, having an opening part in an area where the gate electrode 41 is to be formed. Subsequently, by forming a metal film by vacuum deposition on the resist pattern and the insulating layer 30 at the opening part, and dipping the metal film in an organic solvent, etc., the metal film formed on the resist pattern is removed by being lifted off together with the resist pattern. Accordingly, by the metal film remaining at the opening part of the resist pattern (not illustrated), the gate electrode 41 is formed. At this time, the metal film that is formed is a metal laminated film of Ni/Au. In a HEMT having the structure illustrated in FIG. 1 formed as above, the gate threshold voltage is apt to be unstable.

Next, a description is given of the C-V measurement sample having a structure as illustrated in FIG. 2. This C-V measurement sample has a structure in which a n-GaN layer 51 is formed on the substrate 10, a first electrode 71 and an insulating film 60 are formed on the n-GaN layer 51, and a second electrode 72 is formed on the insulating film 60. The n-GaN layer 51 is formed with n-GaN having a thickness of approximately 1 µm by MOVPE, and Si of $1\times10^{17}/cm^3$ is doped as an impurity element. The first electrode 71 corresponds to the source electrode 42 and the drain electrode 43 described above, and is formed by the same method as that for forming the source electrode 42 and the drain electrode 43. Furthermore, the second electrode 72 corresponds to the gate electrode 41 described above, and is formed by the same method as that for forming the gate electrode 41. Furthermore, the insulating film 60 corresponds to the insulating layer 30 described above, and is formed by the same method as that for forming the insulating layer 30, by forming $Al_2O_3$ having a thickness of approximately 40 nm.

Next, a description is given of the relationship, etc., between a C-V hysteresis width and the substrate temperature when forming the insulating film 60, which is measured with the use of the C-V measurement sample having a structure as illustrated in FIG. 2. Specifically, a plurality of C-V measurement samples are fabricated by varying the substrate temperature when forming the insulating film 60, and in the respective C-V measurement samples that have been fabricated, the capacitance is measured by raising and lowering the voltage applied between the first electrode 71 and the second electrode 72. As a result, in the fabricated C-V measurement samples, even at different voltage values, the capacitance may be the same, in the case where the capacitance is measured while raising the voltage applied between the first electrode 71 and the second electrode 72, and in a case where the capacitance is measured while lowering the voltage. That is to say, there are cases where a hysteresis curve is drawn in the C-V property. In the present embodiment, in the hysteresis curve in the C-V property that has been measured, the voltage difference, which is the width of the voltage value in the hysteresis curve at the average value of the measured capacitance, is described as a C-V hysteresis width. Therefore, the larger the C-V hysteresis width, the larger the voltage difference at the same capacitance in the hysteresis curve in a case where the voltage is raised and the case where the voltage is lowered. When the C-V hysteresis width as described above becomes wide, as in the case of the HEMT having a structure as illustrated in FIG. 1, the gate threshold voltage easily changes, and operations are apt to become unstable.

Figure 3:
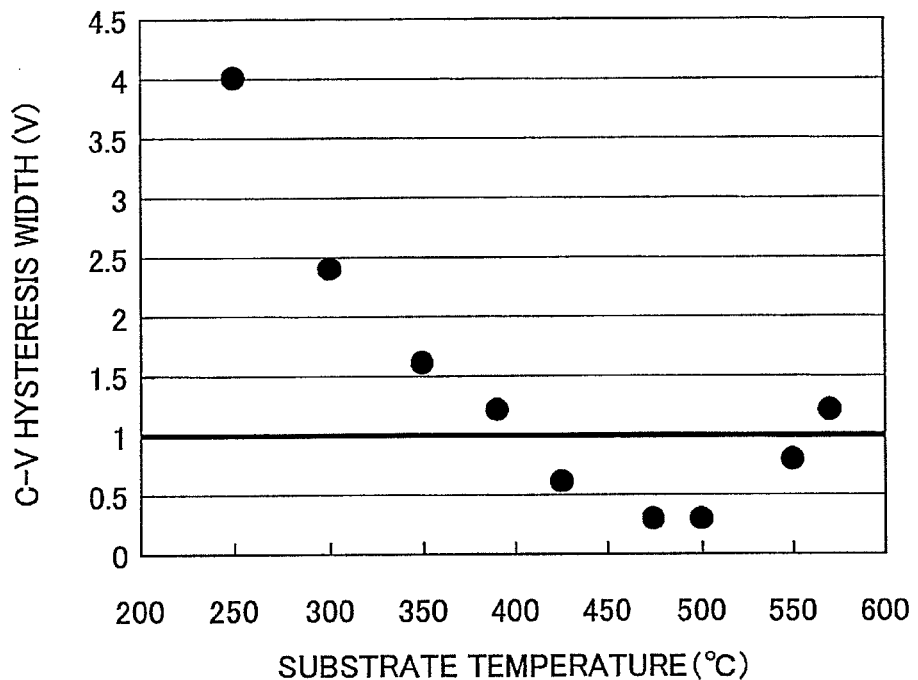
FIG. 3 is a correlation diagram of a substrate temperature and a C-V hysteresis width in an insulating film.

FIG. 3 illustrates the results obtained by fabricating a plurality of C-V measurement samples having the structure as illustrated in FIG. 2 by varying the substrate temperature, and measuring the C-V hysteresis width. Note that the insulating film 60 is formed by forming a film of $Al_2O_3$ by ALD with the use of TMA (trimethyl aluminum) and oxygen plasma. As illustrated in FIG. 3, by raising the substrate temperature higher than 250° C., the C-V hysteresis width becomes narrow, and when the substrate temperature is greater than or equal to 400° C. and less than or equal to 550° C., the C-V hysteresis width becomes less than or equal to 1 V. As described above, when the C-V hysteresis width becomes less than or equal to 1 V, the hysteresis in the C-V property is negligible, and therefore by fabricating a HEMT using such an insulating film, the variation in the gate threshold voltage may be decreased, which is preferable. Note that when the substrate temperature is further raised to approximately 570° C., the C-V hysteresis width increases and exceeds 1 V, which is not very preferable.

Incidentally, further studies were made about the relationship between the substrate temperature and the C-V hysteresis width, and a finding has been achieved, that there is a correlation between the number of —OH groups included in the insulating film 60 and the C-V hysteresis width, and that there is a correlation between the substrate temperature and the number of —OH groups included in the insulating film 60. In the following, detailed descriptions are given of the achieved finding. Note that in the present embodiment, the number of —OH groups indicates the number of —OH groups (hydroxyl groups) included in each unit cube volume, and therefore when there is a large number of —OH groups in the insulating film, a large amount of —OH (hydroxyl groups) is included in each unit cube volume in the insulating film.

Figure 4:
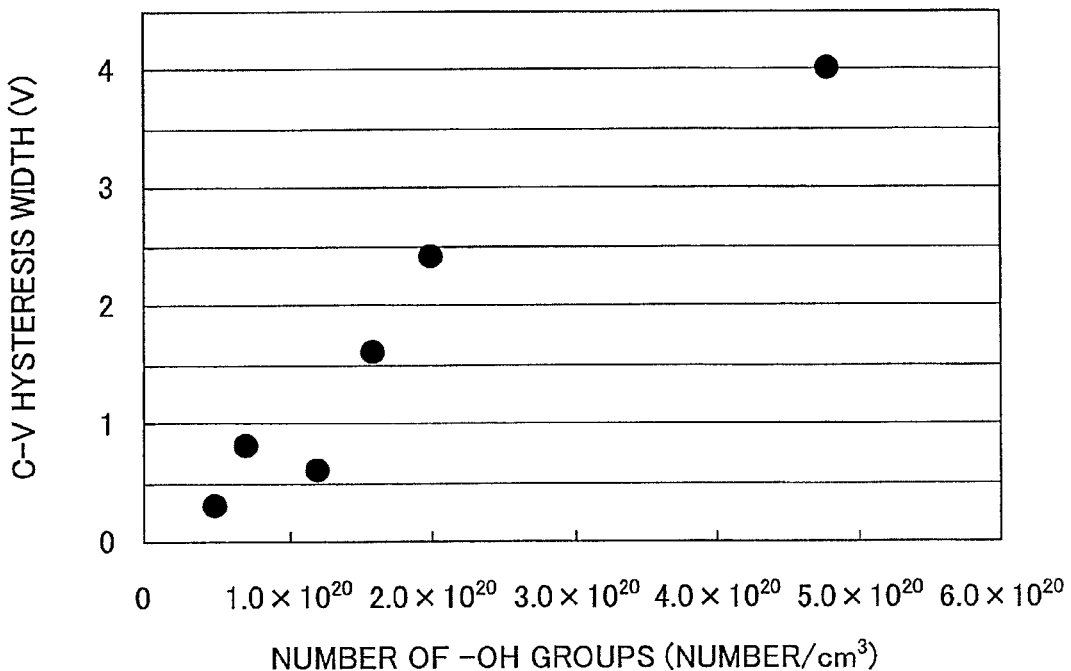
FIG. 4 is a correlation diagram of the number of —OH groups and a C-V hysteresis width in an insulating film.

FIG. 4 indicates the relationship between the number of —OH groups included in the insulating film 60 and the C-V hysteresis width, in $Al_2O_3$ that is (the material of) the insulating film 60 formed by ALD with the use of TMA and oxygen plasma. As illustrated in FIG. 4, when the number of —OH groups included in the insulating film 60 decreases, the C-V hysteresis width is apt to become narrow. Therefore, the factor generating the hysteresis curve in the C-V property is deemed to be that there is —OH present at the interface between the insulating film 60 and the n-GaN layer 51. Thus, it is considered that when there is a small number of —OH groups included in the insulating film 60, there will be a small number of —OH groups at the interface between the insulating film 60 and the n-GaN layer 51, and the C-V hysteresis width becomes narrow.

Figure 5:
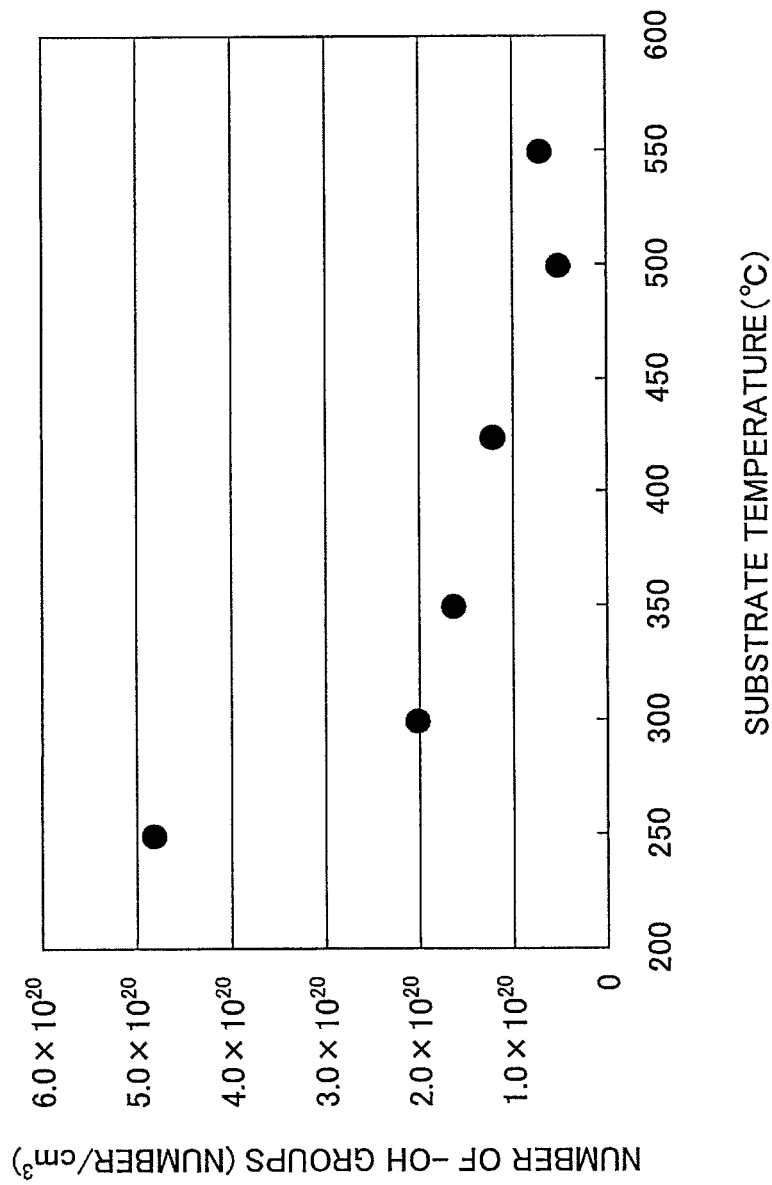
FIG. 5 is a correlation diagram of a substrate temperature and the number of —OH groups in an insulating film.

FIG. 5 illustrates the relationship between the substrate temperature and the number of —OH groups, in $Al_2O_3$ that is the insulating film 60 formed by ALD with the use of TMA and oxygen plasma. As illustrated in FIG. 5, by raising the substrate temperature higher than 250° C., the number of —OH groups decreases, and when the substrate temperature is greater than or equal to 400° C. and less than or equal to 550° C., the number of —OH groups becomes the lowest.

FIG. 6 illustrates the relationship between the number of —OH groups, which is included in $Al_2O_3$ that is the insulating film 60 formed by ALD with the use of TMA and oxygen plasma, and the leak current in the insulating film 60. As illustrated in FIG. 6, when the number of —OH groups included in the insulating film 60 is small, the leak current tends to become high, and when the number of —OH groups included in the insulating film 60 is large, the leak current tends to become low.

Figure 7A:
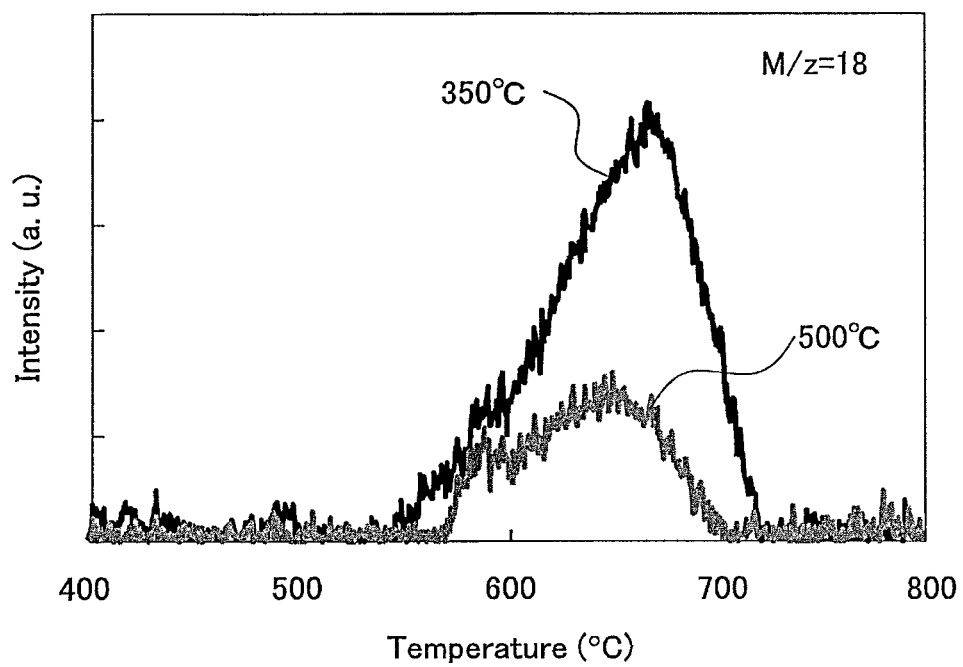
FIGS. 7A and 7B are characteristic diagrams obtained by performing TDS analysis in an insulating film.
Figure 7B:
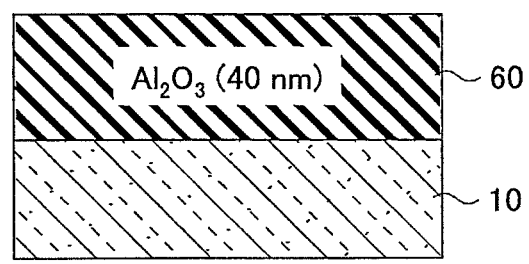

FIG. 7A indicates results obtained by performing TDS (Thermal Desorption Spectroscopy) analysis on $Al_2O_3$ that is the insulating film 60 formed by ALD with the use of TMA and oxygen plasma. Note that in this TDS analysis, samples have been fabricated by forming, on the substrate 10 as illustrated in FIG. 7B, the insulating film 60 having a thickness of 40 nm under conditions where the substrate temperature is 350° C. and 500° C., and measuring the samples. In the $Al_2O_3$ that is the insulating film 60, it is considered that —OH is present in a state of AlOH, and therefore by heating the sample, the following reaction occurs, and it is estimated that $H_2O$ is generated.

$$2Al\text{—}OH \rightarrow Al\text{—}O\text{—}Al + H_2O$$

Thus, in the insulating film 60 formed at a substrate temperature of 350° C., there is large number of —OH groups, and therefore more $H_2O$ molecules are generated as degas in this insulating film 60, compared to that of the insulating film 60 formed at a substrate temperature of 500° C. and including a smaller number of —OH groups.

Figure 8A:
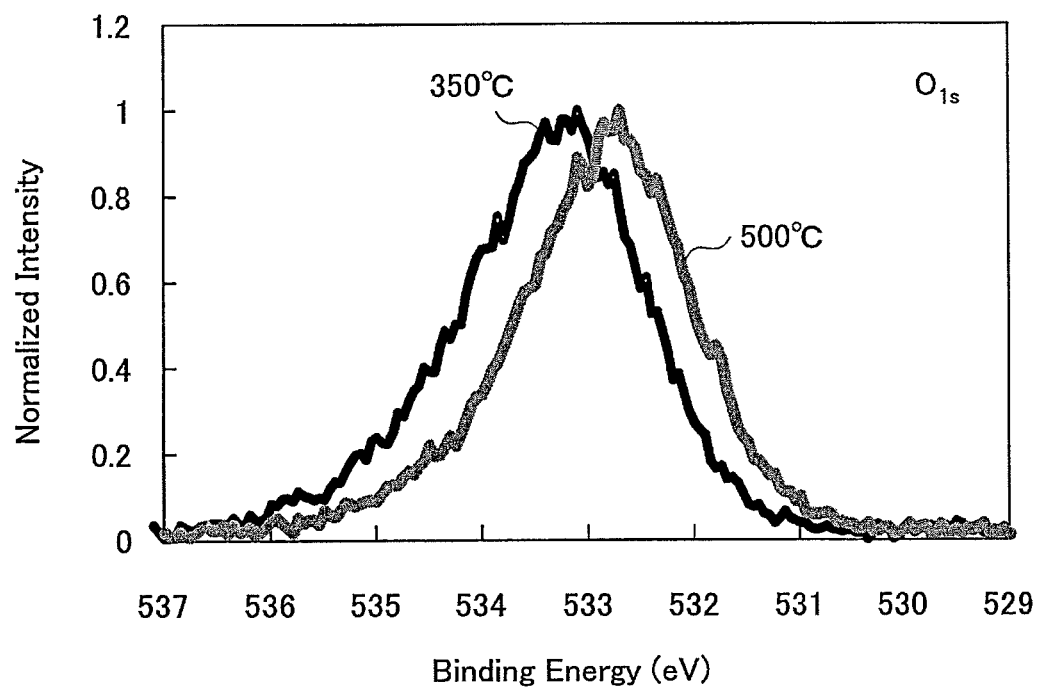
FIGS. 8A and 8B are characteristic diagrams obtained by performing XPS analysis in an insulating film.
Figure 8B:
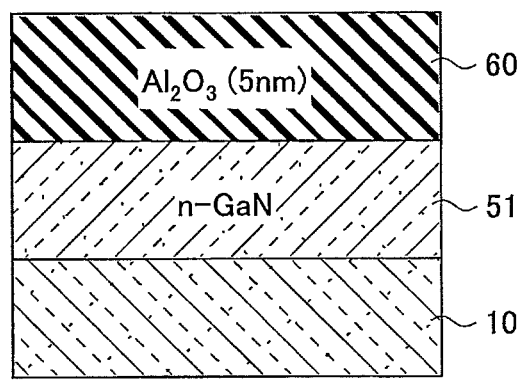

FIG. 8A indicates results obtained by fabricating the sample illustrated in FIG. 8B and performing XPS (X-ray Photoelectron Spectroscopy) analysis. Specifically, the sample has been fabricated by forming the n-GaN layer 51 on the substrate 10 as illustrated in FIG. 8B, and forming, on the n-GaN layer 51, $Al_2O_3$ that is the insulating film 60 formed by ALD with the use of TMA and oxygen plasma, and by performing XPS analysis on the sample. Note that two samples have been fabricated under two substrate temperature conditions of 350° C. and 500° C., and the $Al_2O_3$ that is the insulating film 60 has a thickness of 5 nm in both samples. As a result, as illustrated in FIG. 8B, compared to the sample obtained by forming the insulating film 60 at a substrate temperature of 500° C., in the sample obtained by forming the insulating film 60 at a substrate temperature of 350° C., the spectrum is shifted more toward the high energy side. As described above, when the spectrum is shifted toward the high energy side in XPS analysis, it is suggested that a large number of —OH groups is included. Note that in the XPS analysis, there was hardly any difference in the amount of carbon, whether the substrate temperature has been 350° C. or 500° C. when forming the insulating film 60.

The above findings are relevant to $Al_2O_3$; however, it is estimated that the same tendency may be found for any insulating film formed by ALD using oxygen plasma. That is to say, the same tendency is considered to be found for oxidized films formed by ALD using oxygen plasma, such as $SiO_2$ (silicon oxide), oxide of metal (Hf, Ta, Zr, Ti, La, Y, V, Gd, etc.) such as $HfO_2$, $Ta_2O_5$ and $Gd_2O_3$, etc., and their mixture.

Semiconductor Device

First Embodiment

Figure 9:
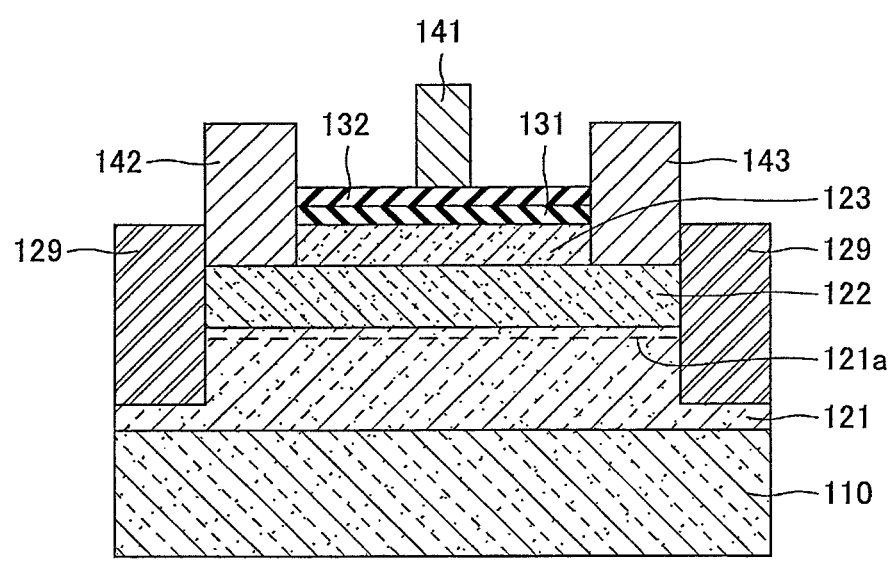
FIG. 9 is a structure diagram of a semiconductor device according to a first embodiment.

Next, a description is given of a semiconductor device according to the present embodiment, based on FIG. 9. The semiconductor device according to the present embodiment has an electron transit layer 121, an electron supply layer 122, and a cap layer 123 laminated on a substrate 110 and made of a nitride semiconductor. Furthermore, on part of the electron transit layer 121, the electron supply layer 122, and the cap layer 123, an element separation area 129 is formed for separating elements. On the cap layer 123, a laminated first insulating layer 131 and a second insulating layer 132 are formed. On parts of the electron supply layer 122, where the cap layer 123 is partially removed, a source electrode 142 and a drain electrode 143 are formed. Furthermore, on the second insulating layer 132, a gate electrode 141 is formed. Note that on the substrate 110, a buffer layer may be formed according to need, in which case the nitride semiconductor layers described above are formed on the buffer layer.

In the present embodiment, the electron transit layer 121 is formed of i-GaN having a thickness of 3 μm, and the electron supply layer 122 is formed of i-$Al_{0.25}Ga_{0.75}N$ having a thickness of 20 nm. The cap layer 123 is formed of n-GaN having a thickness of 5 nm, and Si of $1\times10^{18}$/cm$^3$ is doped in the cap layer 123 as an impurity element. Accordingly, at the part of the electron transit layer 121 near the interface between the electron transit layer 121 and the electron supply layer 122, 2DEG 121a is generated. Note that in the present embodiment, the electron transit layer 121 may be referred to as a first semiconductor layer, the electron supply layer 122 may be referred to as a second semiconductor layer, and the cap layer 123 may be referred to as a third semiconductor layer.

The first insulating layer 131 and the second insulating layer 132 are both formed of $Al_2O_3$ (aluminum oxide) by ALD with the use of TMA and oxygen plasma. The first insulating layer 131 preferably has a film thickness greater than or equal to 1 nm and less than or equal to 96 nm, and the second insulating layer 132 preferably has a film thickness greater than or equal to 4 nm and less than or equal to 99 nm. Furthermore, the sum of the film thicknesses of the first insulating layer 131 and the second insulating layer 132 is preferably greater than or equal to 5 nm and less than or equal to 100 nm. Note that in the present embodiment, the first insulating layer 131 is formed to have a film thickness of approximately 20 nm, and the second insulating layer 132 is formed to have a film thickness of approximately 20 nm.

In the present embodiment, as described below, by changing the film forming condition such as the substrate temperature, the insulating films are formed so that the number of —OH groups included in the first insulating layer 131 is less than the number of —OH groups included in the second insulating layer 132. Specifically, the substrate temperature when forming the first insulating layer 131 is set to be higher than the substrate temperature when forming the second insulating layer 132, and therefore the number of —OH groups included in the first insulating layer 131 is made to be less than the number of —OH groups included in the second insulating layer 132. In the present embodiment, when forming the first insulating layer 131, the substrate temperature is set to be greater than or equal to 400° C. and less than or equal to 550° C., for example, at approximately 500° C., and when forming the second insulating layer 132, the substrate temperature is set at approximately 350° C.

As described above, in the present embodiment, the first insulating layer 131 and the second insulating layer 132 are laminated, so that the advantages of both layers are achieved, i.e., variations in the gate threshold voltage are decreased, and the gate leak current is reduced.

Figure 10:
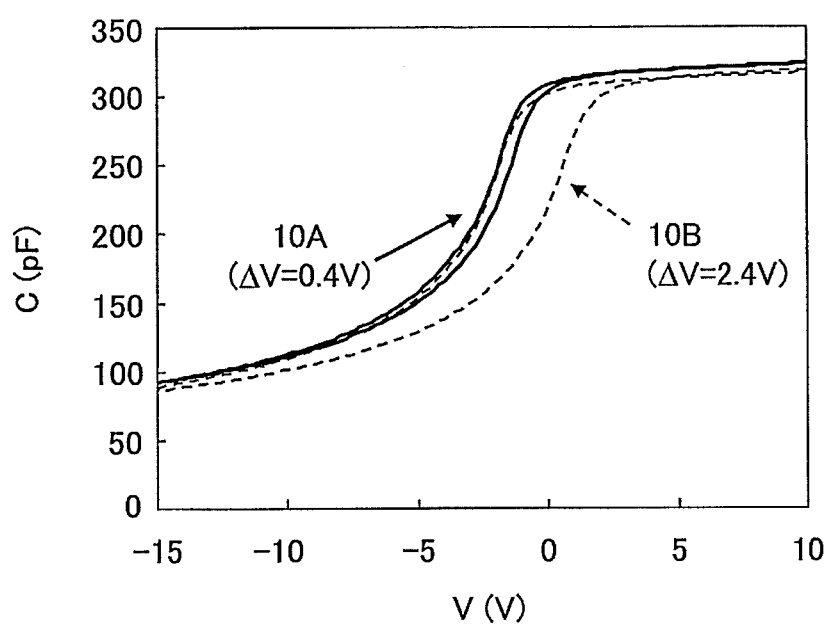
FIG. 10 is a C-V characteristic diagram of an insulating film.

FIG. 10 illustrates the results obtained by fabricating the C-V measurement sample having the structure illustrated in FIG. 2 by using the first insulating layer 131 and the second insulating layer 132 described above, and measuring the C-V property of the sample. Specifically, 10A in FIG. 10 is the C-V property of the C-V measurement sample having the structure illustrated in FIG. 2, in which the insulating film 60 is formed of the first insulating layer 131 and the second insulating layer 132 of the semiconductor device according to the present embodiment. Note that as described above, both the first insulating layer 131 and the second insulating layer 132 are formed of $Al_2O_3$ by performing ALD with the use of TMA and oxygen plasma. The first insulating layer 131 is formed under a condition where the substrate temperature is 500° C. to have a thickness of approximately 20 nm, and the second insulating layer 132 is formed under a condition where the substrate temperature is 350° C. to have a thickness of approximately 20 nm. Furthermore, 10B in FIG. 10 is the C-V property of the C-V measurement sample having the structure illustrated in FIG. 2, in which the insulating film 60 is formed under a condition where the substrate temperature is 350° C. to have a thickness of approximately 40 nm, by $Al_2O_3$ formed by ALD with the use of TMA and oxygen plasma.

As illustrated in FIG. 10, the C-V hysteresis width (ΔV) at the average value of the capacitance measured by the hysteresis curve in the C-V property, is 0.4 V at 10A, whereas this C-V hysteresis width is 2.4 V at 10B. Thus, by the C-V measurement sample using the insulating film according to the present embodiment, the C-V hysteresis width may be made narrower, and therefore in the semiconductor device according to the present embodiment, variations in the gate threshold voltage are decreased.

Figure 11:
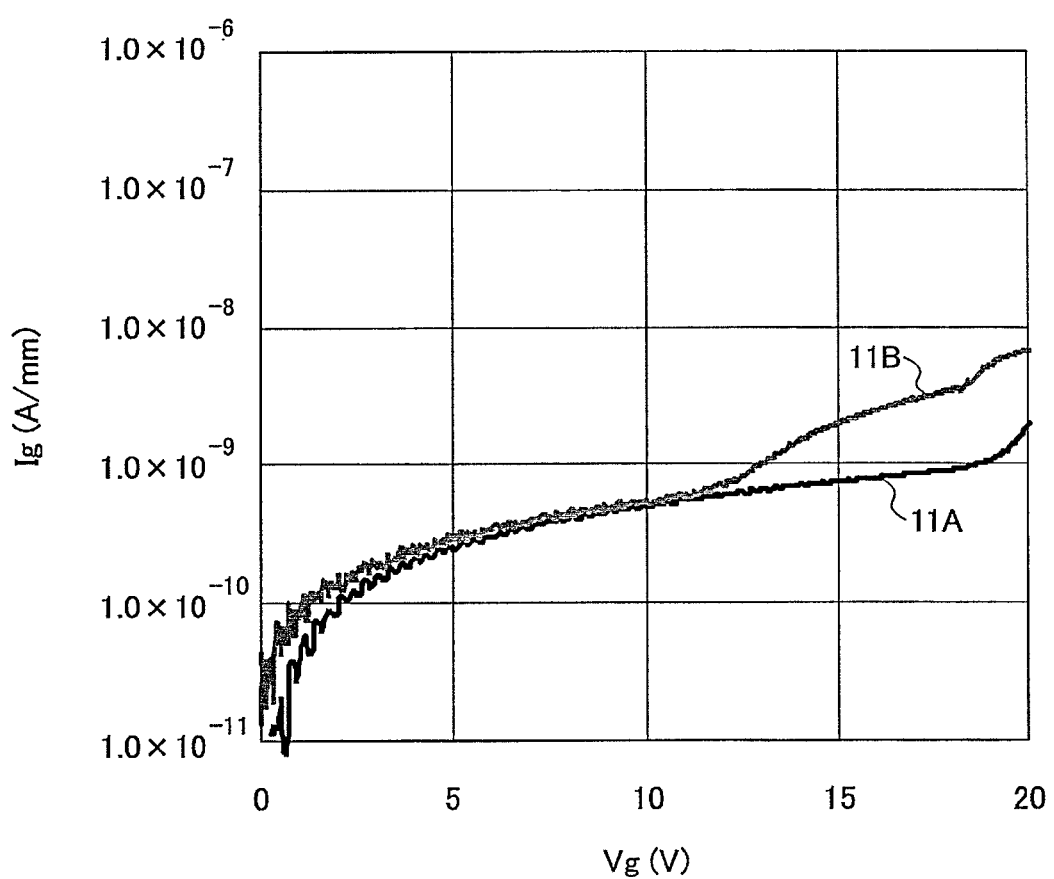
FIG. 11 is a Vg-Ig characteristic diagram of a semiconductor device.

FIG. 11 illustrates the Vg-Ig (gate voltage-gate current) property in the semiconductor device. In FIG. 11, 11A is the Vg-Ig property in the semiconductor device according to the present embodiment illustrated in FIG. 9. In FIG. 11, 11B is the Vg-Ig property in the semiconductor device having the structure illustrated in FIG. 1. As illustrated in FIG. 11, in the property of the semiconductor device according to the present embodiment, the gate current Ig is lower than that of 11B of the semiconductor device having the structure illustrated in FIG. 1; particularly, this tendency is significant when the gate voltage Vg is near 12 V. Therefore, by the semiconductor device according to the present embodiment, the gate leak current is lower than that of the semiconductor device having the structure illustrated in FIG. 1.

Note that the first insulating layer 131 and the second insulating layer 132 are considered to achieve the same effects as long as they are insulating films formed by ALD with the use of oxygen plasma, and therefore the first insulating layer 131 and the second insulating layer 132 may be oxide films such as $SiO_2$ (silicon oxide), oxide of metal (Hf, Ta, Zr, Ti, La, Y, V, Gd, etc.) such as $HfO_2$, $Ta_2O_5$ and $Gd_2O_3$, etc., and their mixture.

Furthermore, in the present embodiment a description is given of a case where the electron supply layer 122 is formed of AlGaN; however, the same applies in a case where the electron supply layer 122 is formed of InGaAlN and InAlN.

Method of Manufacturing Semiconductor Device

First Embodiment

Next, a description is given of a method of manufacturing the semiconductor device according to the present embodiment based on FIGS. 12A through 13C.

Figure 12A:
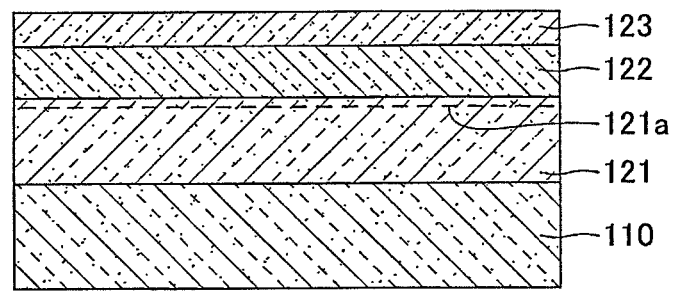
FIGS. 12A through 12C are process diagrams of a method of manufacturing a semiconductor device according to the first embodiment (1)

First, as illustrated in FIG. 12A, on the substrate 110, by MOVPE, a buffer layer (not illustrated), the electron transit layer 121, the electron supply layer 122, and the cap layer 123 are formed by being sequentially laminated. The electron transit layer 121 is formed of i-GaN having a thickness of 3 μm, and the electron supply layer 122 is formed of i-$Al_{0.25}Ga_{0.75}N$ having a thickness of 20 nm. Furthermore, the cap layer 123 is formed of n-GaN having a thickness of 5 nm, and Si of $1 \times 10^{18}/cm^3$ is doped as an impurity element that becomes n type.

Figure 12B:
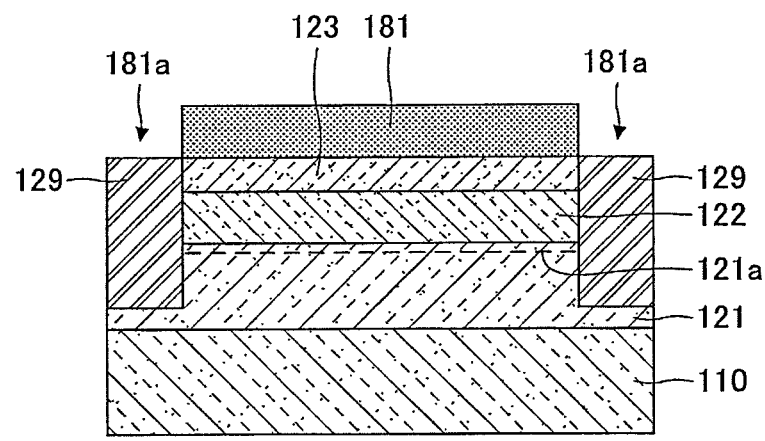

Next, as illustrated in FIG. 12B, the element separation area 129 is formed. Specifically, a photoresist is applied on the cap layer 123, and exposing and developing are performed by an exposing device, thereby forming a resist pattern 181 having an opening part 181a in an area where the element separation area 129 is to be formed. Subsequently, ions such as Ar are implanted in part of the cap layer 123, the electron supply layer 122, and the electron transit layer 121 at the opening part 181a of the resist pattern 181, to form the element separation area 129. Note that the element separation area 129 may be formed by removing part of the cap layer 123, the electron supply layer 122, and the electron transit layer 121 by dry etching using chlorinated gas.

Figure 12C:
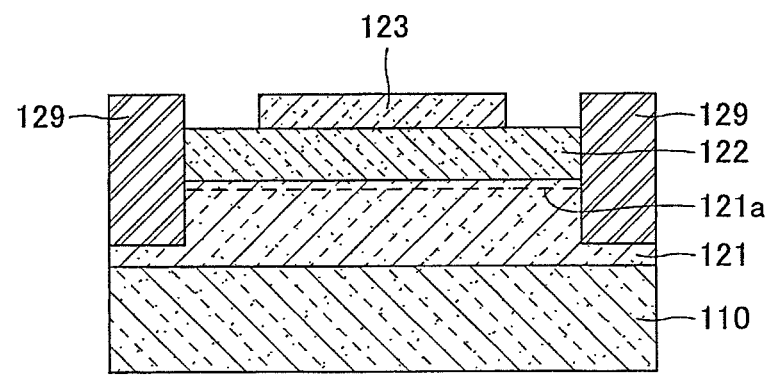

Next, as illustrated in FIG. 12C, the cap layer 123 is removed in the area where the source electrode 142 and the drain electrode 143 are to be formed, so that the electron supply layer 122 is exposed. Specifically, the resist pattern 181 is removed with an organic solvent, etc., and then a photoresist is applied again on the cap layer 123, and exposing and developing are performed by an exposing device. Accordingly, a resist pattern (not illustrated) is formed, having an opening part in the area where the source electrode 142 and the drain electrode 143 are to be formed. Subsequently, the cap layer 123 at the opening part of the resist pattern is removed by RIE, etc., so that the electron supply layer 122 is exposed in the area where the source electrode 142 and the drain electrode 143 are to be formed. Subsequently, the resist pattern (not illustrated) is removed by an organic solvent, etc.

Figure 13A:
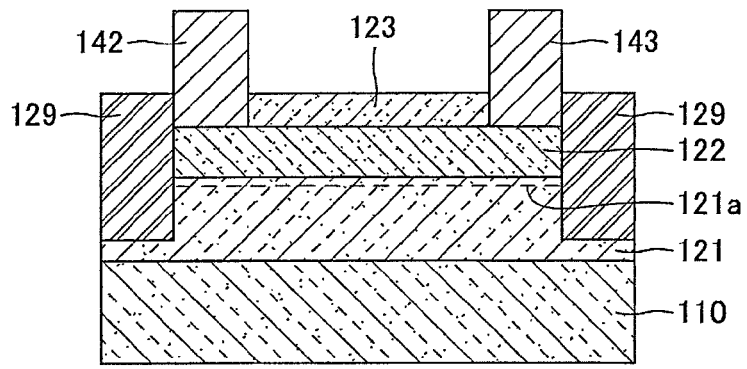
FIGS. 13A through 13C are process diagrams of a method of manufacturing a semiconductor device according to the first embodiment (2)

Next, as illustrated in FIG. 13A, the source electrode 142 and the drain electrode 143 are formed on the exposed electron supply layer 122. Specifically, a photoresist is applied again on the cap layer 123 and the electron supply layer 122, and exposing and developing are performed by an exposing device. Accordingly, a resist pattern (not illustrated) is formed, having an opening part in the area where the source electrode 142 and the drain electrode 143 are to be formed. Subsequently, by forming a metal film by vacuum deposition on the resist pattern and the electron supply layer 122 at the opening part, and dipping the metal film in an organic solvent, etc., the metal film formed on the resist pattern is removed by being lifted off together with the resist pattern. Accordingly, by the metal film remaining at the opening part of the resist pattern (not illustrated), the source electrode 142 and the drain electrode 143 are formed. At this time, the metal film that is formed is a metal laminated film of Ti/Al, which is made to have ohmic contact by subsequently performing a heat treatment at a temperature of approximately 700° C.

Figure 13B:
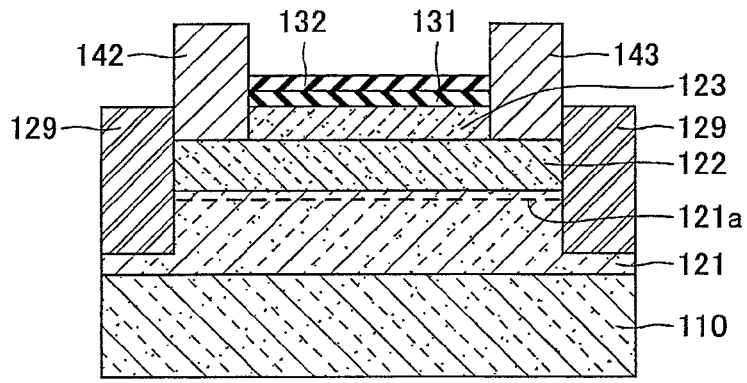

Next, as illustrated in FIG. 13B, on the cap layer 123, by performing ALD, the first insulating layer 131 and the second insulating layer 132 constituted by $Al_2O_3$, etc., are laminated. Specifically, on the cap layer 123, the first insulating layer 131 and the second insulating layer 132 are formed of $Al_2O_3$ by performing ALD with the use of TMA and oxygen plasma. In the present embodiment, the first insulating layer 131 is formed under a substrate temperature condition of approximately 500° C. to have a thickness of approximately 20 nm, and the second insulating layer 132 is formed under a substrate temperature condition of approximately 350° C. to have a thickness of approximately 20 nm. Note that in order to form the first insulating layer 131 and the second insulating layer 132 in the area where the cap layer 123 is exposed, after forming the first insulating layer 131 and the second insulating layer 132, a photoresist is applied, and exposing and developing are performed by an exposing device. Accordingly, a resist pattern (not illustrated) is formed on the second insulating layer 132 on the cap layer 123. Subsequently, by removing the first insulating layer 131 and the second insulating layer 132 by RIE, etc., in the area where the resist pattern is not formed, the first insulating layer 131 and the second insulating layer 132 are formed on the cap layer 123. The resist pattern (not illustrated) is subsequently removed by an organic solvent, etc.

Figure 13C:
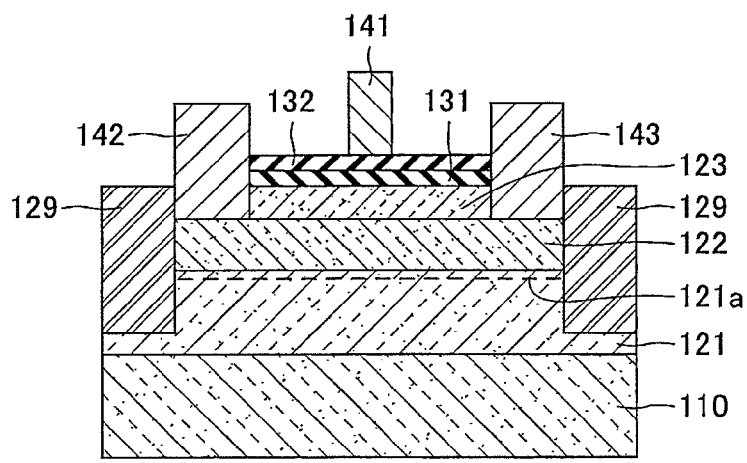

Next, as illustrated in FIG. 13C, the gate electrode 141 is formed in a predetermined area on the second insulating layer 132. Specifically, on the second insulating layer 132, the source electrode 142, and the drain electrode 143, a photoresist is applied, and exposing and developing are performed by an exposing device, so that a resist pattern (not illustrated) is formed, which has an opening part in the area where the gate electrode 141 is to be formed. Subsequently, by forming a metal film by vacuum deposition on the resist pattern and the second insulating layer 132 at the opening part, and dipping the metal film in an organic solvent, etc., the metal film formed on the resist pattern is removed by being lifted off together with the resist pattern. Accordingly, by the metal film remaining at the opening part of the resist pattern (not illustrated), the gate electrode 141 is formed. At this time, the metal film that is formed is a metal laminated film of Ni/Au.

By the above manufacturing method, the semiconductor device according to the present embodiment is manufactured.

Second Embodiment

Figure 14:
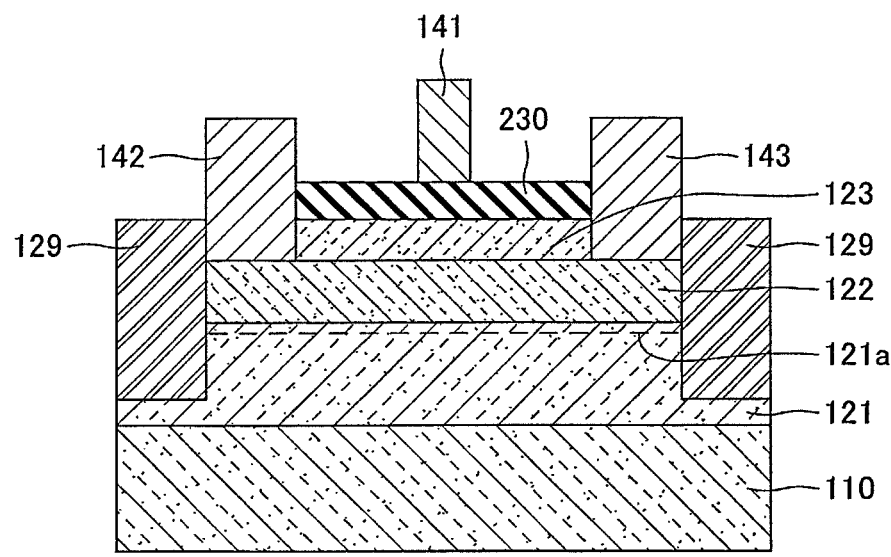
FIG. 14 is a structure diagram of a semiconductor device according to a second embodiment.

Next, a description is given of a second embodiment based on FIG. 14. The present embodiment has a structure in which the insulating layer, which corresponds to the part where the first insulating layer 131 and the second insulating layer 132 are formed in the semiconductor device according to the first embodiment, are formed by changing the film forming conditions. Specifically, the semiconductor device according to the present embodiment has a structure in which $Al_2O_3$ is formed on the cap layer 123 by ALD with the use of TMA and oxygen plasma while gradually decreasing the substrate temperature, so that an insulating layer 230 is formed. Accordingly, the insulating layer 230 is formed so that the number of —OH groups is minimum near the interface between the insulating layer 230 and the cap layer 123, and the number of —OH groups gradually increases from the side where the cap layer 123 is formed toward the surface of the insulating layer 230. Note that the film thickness of the insulating layer 230 that is formed is approximately 40 nm.

In the present embodiment, for example, the insulating layer 230 is formed under the conditions where the substrate temperature is 500° C. when starting to form the insulating layer 230, and the substrate temperature is 350° C. when the forming of the insulating layer 230 is completed. By the semiconductor device according to the present embodiment that is formed as described above, the same effects as those of the first embodiment are achieved.

In the present embodiment, a description is given of a case where the insulating layer 230 is formed while decreasing the substrate temperature; however, the insulating layer 230 may have a structure formed by laminating three or more layers of insulating films which have been formed under different substrate temperature conditions.

Note that the contents other than the above are the same as the first embodiment.

Third Embodiment

Semiconductor Device

Third Embodiment

Figure 15:
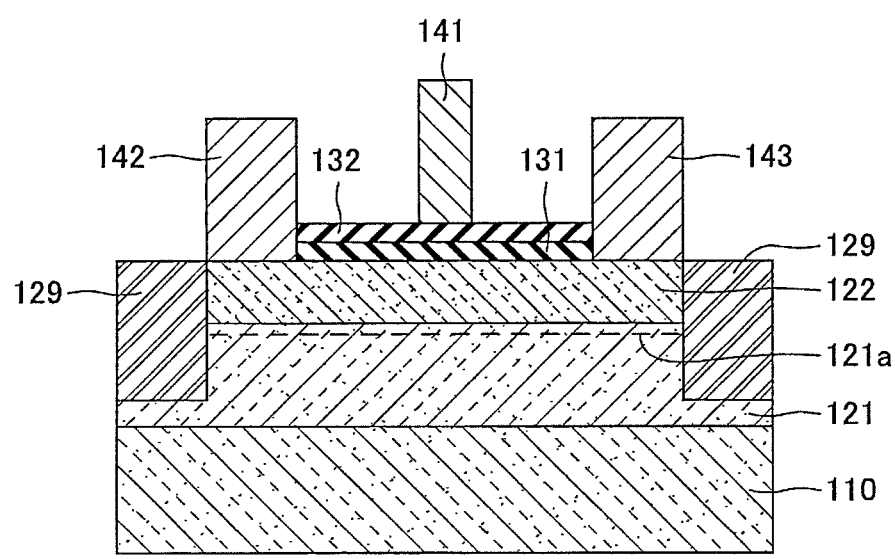
FIG. 15 is a structure diagram of a semiconductor device according to a third embodiment.

Next, a description is given of a semiconductor device according to the present embodiment, based on FIG. 15. The semiconductor device according to the present embodiment has an electron transit layer 121 and an electron supply layer 122 laminated on a substrate 110 and made of a nitride semiconductor. Furthermore, on part of the electron transit layer 121 and the electron supply layer 122, an element separation area 129 is formed for separating elements. On the electron supply layer 122, the laminated first insulating layer 131 and the second insulating layer 132 are formed, together with the source electrode 142 and the drain electrode 143. Furthermore, on the second insulating layer 132, the gate electrode 141 is formed. Note that on the substrate 110, a buffer layer may be formed according to need, in which case the nitride semiconductor layers described above are formed on the buffer layer.

In the present embodiment, the electron transit layer 121 is formed of i-GaN having a thickness of 3 μm, and the electron supply layer 122 is formed of i-$Al_{0.25}Ga_{0.75}N$ having a thickness of 20 nm. Accordingly, at the part of the electron transit layer 121 near the interface between the electron transit layer 121 and the electron supply layer 122, 2DEG 121a is generated.

The first insulating layer 131 and the second insulating layer 132 are both formed of $Al_2O_3$ by performing ALD with the use of TMA and oxygen plasma. The first insulating layer 131 preferably has a film thickness greater than or equal to 1 nm and less than or equal to 96 nm, and the second insulating layer 132 preferably has a film thickness greater than or equal to 4 nm and less than or equal to 99 nm. Furthermore, the sum of the film thicknesses of the first insulating layer 131 and the second insulating layer 132 is preferably greater than or equal to 5 nm and less than or equal to 100 nm. Note that in the present embodiment, the first insulating layer 131 is formed to have a film thickness of approximately 20 nm, and the second insulating layer 132 is formed to have a film thickness of approximately 20 nm.

In the present embodiment, by changing the film forming condition such as the substrate temperature, the insulating films are formed so that the number of —OH groups included in the first insulating layer 131 is less than the number of —OH groups included in the second insulating layer 132. Specifically, the substrate temperature when forming the first insulating layer 131 is set to be higher than the substrate temperature when forming the second insulating layer 132, and therefore the number of —OH groups included in the first insulating layer 131 is made to be less than the number of —OH groups included in the second insulating layer 132. In the present embodiment, when forming the first insulating layer 131, the substrate temperature is set to be greater than or equal to 400° C. and less than or equal to 550° C., for example, at approximately 500° C., and when forming the second insulating layer 132, the substrate temperature is set at approximately 350° C.

As described above, the first insulating layer 131 and the second insulating layer 132 are formed by being laminated on each other, so that the advantages of both layers are achieved, i.e., variations in the gate threshold voltage are decreased, and the gate leak current is reduced.

Method of Manufacturing Semiconductor Device

Third Embodiment

Next, a description is given of a method of manufacturing the semiconductor device according to the present embodiment based on FIGS. 16A through 17B.

Figure 16A:
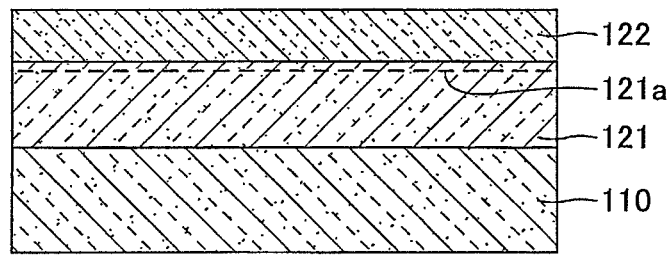
FIGS. 16A through 16C are process diagrams of a method of manufacturing a semiconductor device according to the third embodiment (1)

First, as illustrated in FIG. 16A, on the substrate 110, by MOVPE, a buffer layer (not illustrated), the electron transit layer 121 and the electron supply layer 122 are formed by being sequentially laminated. The electron transit layer 121 is formed of i-GaN having a thickness of 3 μm, and the electron supply layer 122 is formed of i-$Al_{0.25}Ga_{0.75}N$ having a thickness of 20 nm.

Figure 16B:
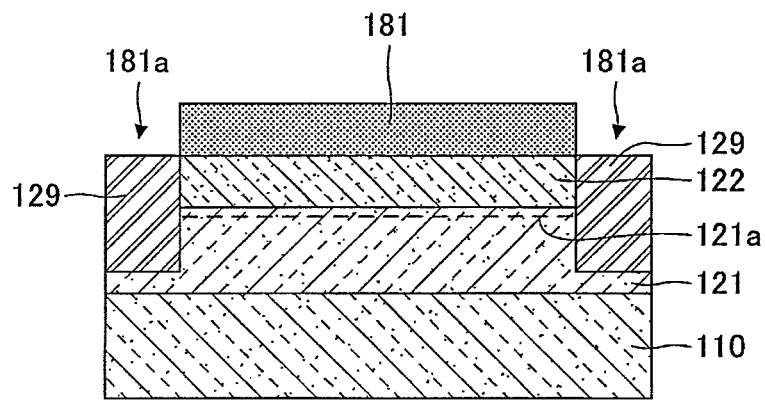

Next, as illustrated in FIG. 16B, the element separation area 129 is formed. Specifically, a photoresist is applied on the electron supply layer 122, and exposing and developing are performed by an exposing device, thereby forming a resist pattern 181 having an opening part 181a in an area where the element separation area 129 is to be formed. Subsequently, ions such as Ar are implanted in part of the electron supply layer 122 and the electron transit layer 121 at the opening part 181a of the resist pattern 181, to form the element separation area 129. Note that the element separation area 129 may be formed by removing part of the electron supply layer 122 and the electron transit layer 121 by dry etching using chlorinated gas.

Figure 16C:
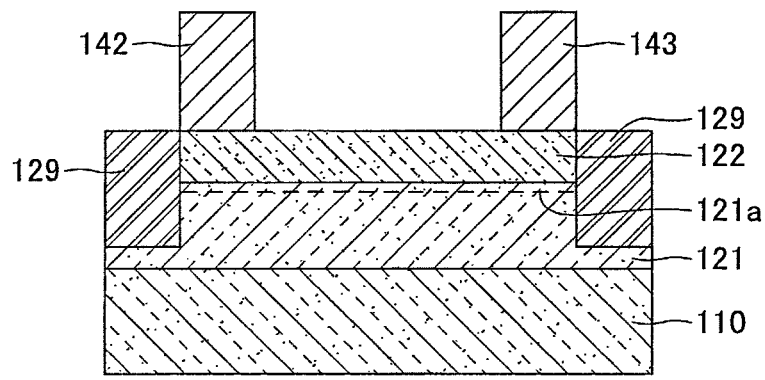

Next, as illustrated in FIG. 16C, the source electrode 142 and the drain electrode 143 are formed on the electron supply layer 122. Specifically, a photoresist is applied on the electron supply layer 122, and exposing and developing are performed by an exposing device. Accordingly, a resist pattern (not illustrated) is formed, having an opening part in the area where the source electrode 142 and the drain electrode 143 are to be formed. Subsequently, by forming a metal film by vacuum deposition on the resist pattern and the electron supply layer 122 at the opening part, and dipping the metal film in an organic solvent, etc., the metal film formed on the resist pattern is removed by being lifted off together with the resist pattern. Accordingly, by the metal film remaining at the opening part of the resist pattern (not illustrated), the source electrode 142 and the drain electrode 143 are formed. At this time, the metal film that is formed is a metal laminated film of Ti/Al, which is made to have ohmic contact by subsequently performing a heat treatment at a temperature of approximately 700° C.

Figure 17A:
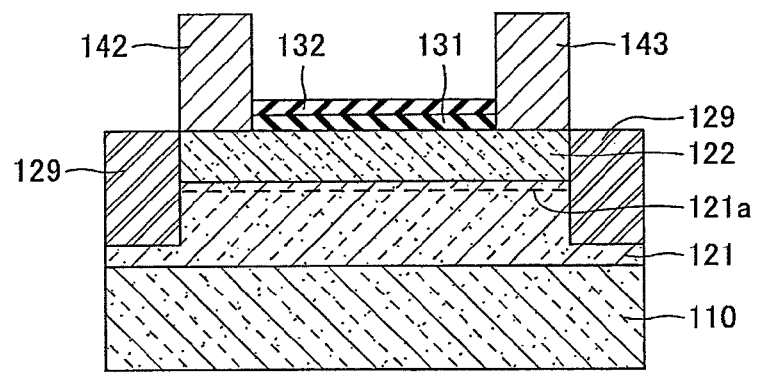
FIGS. 17A and 17B are process diagrams of a method of manufacturing a semiconductor device according to the third embodiment (2)

Next, as illustrated in FIG. 17A, on the electron supply layer 122, by performing ALD, the first insulating layer 131 and the second insulating layer 132 are laminated, which are constituted by $Al_2O_3$, etc. Specifically, on the electron supply layer 122, the first insulating layer 131 and the second insulating layer 132 are formed of $Al_2O_3$ by performing ALD with the use of TMA and oxygen plasma. In the present embodiment, the first insulating layer 131 is formed under a substrate temperature condition of approximately 500° C. to have a thickness of approximately 20 nm, and the second insulating layer 132 is formed under a substrate temperature condition of approximately 350° C. to have a thickness of approximately 20 nm. Note that in order to form the first insulating layer 131 and the second insulating layer 132 in the area where the electron supply layer 122 is exposed, after forming the first insulating layer 131 and the second insulating layer 132, a photoresist is applied, and exposing and developing are performed by an exposing device. Accordingly, a resist pattern (not illustrated) is formed on the second insulating layer 132 on the electron supply layer 122. Subsequently, by removing the first insulating layer 131 and the second insulating layer 132 by RIE, etc., in the area where the resist pattern is not formed, the first insulating layer 131 and the second insulating layer 132 are formed on the electron supply layer 122. The resist pattern (not illustrated) is subsequently removed by an organic solvent, etc.

Figure 17B:
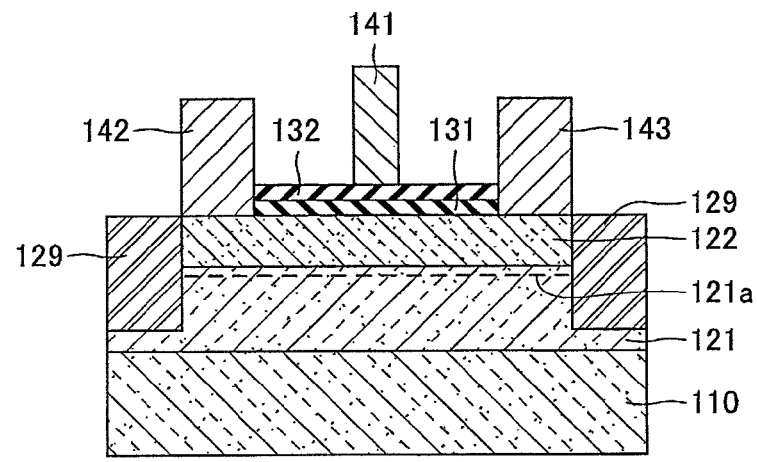

Next, as illustrated in FIG. 17B, the gate electrode 141 is formed in a predetermined area on the second insulating layer 132. Specifically, on the second insulating layer 132, the source electrode 142, and the drain electrode 143, a photoresist is applied, and exposing and developing are performed by an exposing device, so that a resist pattern (not illustrated) is formed, which has an opening part in the area where the gate electrode 141 is to be formed. Subsequently, by forming a metal film by vacuum deposition on the resist pattern and the second insulating layer 132 at the opening part, and dipping the metal film in an organic solvent, etc., the metal film formed on the resist pattern is removed by being lifted off together with the resist pattern. Accordingly, by the metal film remaining at the opening part of the resist pattern (not illustrated), the gate electrode 141 is formed. At this time, the metal film that is formed is a metal laminated film of Ni/Au.

By the above manufacturing method, the semiconductor device according to the present embodiment is manufactured.

Note that the contents other than the above are the same as the first embodiment. Furthermore, in the present embodiment, instead of the first insulating layer 131 and the second insulating layer 132, the insulating layer 230 according to the second embodiment may be formed.

Fourth Embodiment

Figure 18:
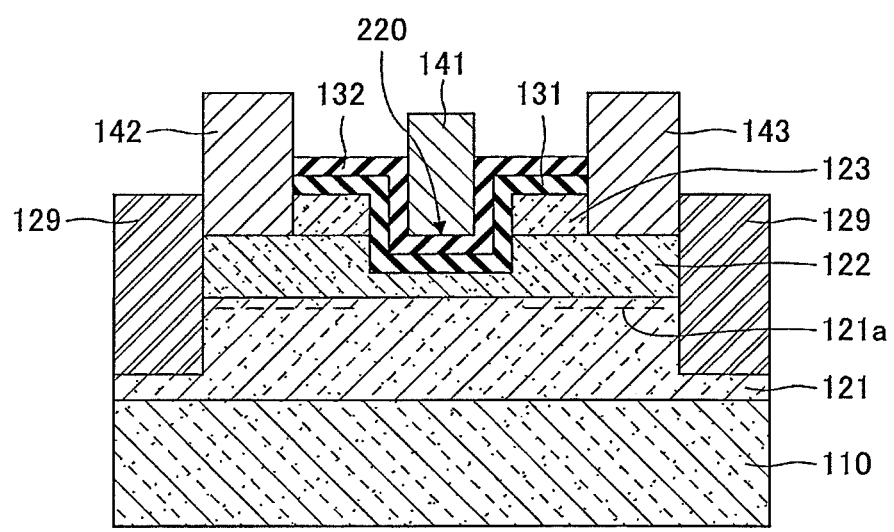
FIG. 18 is a structure diagram of a semiconductor device according to a fourth embodiment.

Next, a description is given of a semiconductor device according to a fourth embodiment, based on FIG. 18. The semiconductor device according to the present embodiment has an electron transit layer 121, an electron supply layer 122, and a cap layer 123 laminated on a substrate 110 and made of a nitride semiconductor.

Furthermore, on part of the electron transit layer 121, the electron supply layer 122, and the cap layer 123, an element separation area 129 is formed for separating elements. Immediately below the area where the gate electrode 141 is to be formed, parts of the cap layer 123 and the electron supply layer 122 are removed, so that a gate recess 220 is formed. Furthermore, on the electron supply layer 122 that is exposed by removing the cap layer 123, the source electrode 142 and the drain electrode 143 are formed. On the nitride semiconductor including the area where the gate recess 220 is formed, the laminated first insulating layer 131 and second insulating layer 132 are formed, and on the second insulating layer 132 in the area where the gate recess 220 is formed, the gate electrode 141 is formed. Note that on the substrate 110, a buffer layer may be formed according to need, in which case the nitride semiconductor layers described above are formed on the buffer layer.

In the present embodiment, the electron transit layer 121 is formed of i-GaN having a thickness of 3 μm, and the electron supply layer 122 is formed of i-$Al_{0.25}Ga_{0.75}N$ having a thickness of 20 nm. The cap layer 123 is formed of n-GaN having a thickness of 5 nm, and Si of $1 \times 10^{18}/cm^3$ is doped in the cap layer 23 as an impurity element.

Accordingly, at the part of the electron transit layer 121 near the interface between the electron transit layer 121 and the electron supply layer 122, 2DEG 121a is generated.

The gate recess 220 may be formed by removing the cap layer 123 and the electron supply layer 122 so that the electron transit layer 121 is exposed, or may be formed by removing part of the cap layer 123, the electron supply layer 122, and the electron transit layer 121.

The first insulating layer 131 and the second insulating layer 132 are both formed of $Al_2O_3$ by performing ALD with the use of TMA and oxygen plasma. The first insulating layer 131 preferably has a film thickness greater than or equal to 1 nm and less than or equal to 96 nm, and the second insulating layer 132 preferably has a film thickness greater than or equal to 4 nm and less than or equal to 99 nm. Furthermore, the sum of the film thicknesses of the first insulating layer 131 and the second insulating layer 132 is preferably greater than or equal to 5 nm and less than or equal to 100 nm. Note that in the present embodiment, the first insulating layer 131 is formed to have a film thickness of approximately 20 nm, and the second insulating layer 132 is formed to have a film thickness of approximately 20 nm.

In the present embodiment, by changing the film forming condition such as the substrate temperature, the insulating films are formed so that the number of —OH groups included in the first insulating layer 131 is less than the number of —OH groups included in the second insulating layer 132. Specifically, the substrate temperature when forming the first insulating layer 131 is set to be higher than the substrate temperature when forming the second insulating layer 132, and therefore the number of —OH groups included in the first insulating layer 131 is made to be less than the number of —OH groups included in the second insulating layer 132. In the present embodiment, when forming the first insulating layer 131, the substrate temperature is set to be greater than or equal to 400° C. and less than or equal to 550° C., for example, at approximately 500° C., and when forming the second insulating layer 132, the substrate temperature is set at approximately 350° C.

As described above, the first insulating layer 131 and the second insulating layer 132 are formed by being laminated on each other, so that the advantages of both layers are achieved, i.e., variations in the gate threshold voltage are decreased, and the gate leak current is reduced.

Furthermore, in the semiconductor device according to the present embodiment, by forming the gate recess 220, normally-off may be achieved.

Method of Manufacturing Semiconductor Device

Fifth Embodiment

Next, a description is given of a method of manufacturing the semiconductor device according to the present embodiment based on FIGS. 19A through 21.

Figure 19A:
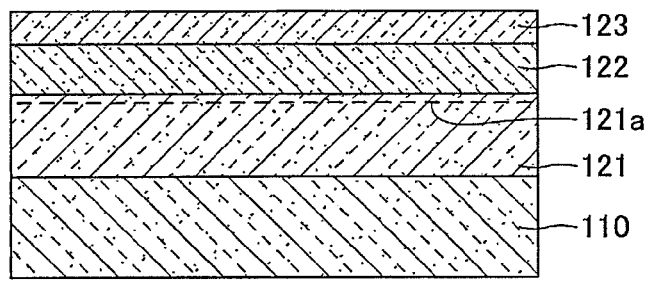
FIGS. 19A through 19C are process diagrams of a method of manufacturing a semiconductor device according to the fourth embodiment (1)

First, as illustrated in FIG. 19A, on the substrate 110, by MOVPE, a buffer layer (not illustrated), the electron transit layer 121, the electron supply layer 122, and the cap layer 123 are formed by being sequentially laminated. The electron transit layer 121 is formed of i-GaN having a thickness of 3 μm, and the electron supply layer 122 is formed of i-$Al_{0.25}Ga_{0.75}N$ having a thickness of 20 nm. Furthermore, the cap layer 123 is formed of n-GaN having a thickness of 5 nm, and as an impurity element that becomes n type, Si of $1\times10^{18}/cm^3$ is doped.

Figure 19B:
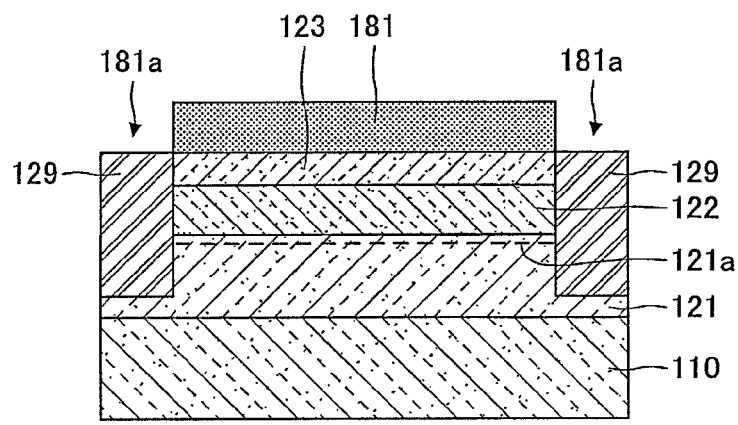

Next, as illustrated in FIG. 19B, the element separation area 129 is formed. Specifically, a photoresist is applied on the cap layer 123, and exposing and developing are performed by an exposing device, thereby forming a resist pattern 181 having an opening part 181a in an area where the element separation area 129 is to be formed. Subsequently, ions such as Ar are implanted in part of the cap layer 123, the electron supply layer 122, and the electron transit layer 121 at the opening part 181a of the resist pattern 181, to form the element separation area 129. Note that the element separation area 129 may be formed by removing part of the cap layer 123, the electron supply layer 122, and the electron transit layer 121 by dry etching using chlorinated gas.

Figure 19C:
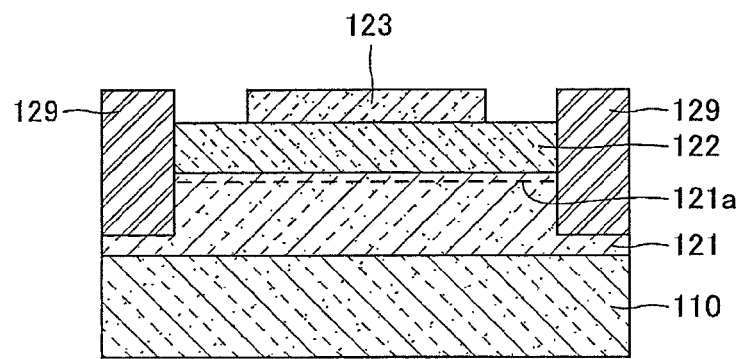

Next, as illustrated in FIG. 19C, the cap layer 123 is removed in the area where the source electrode 142 and the drain electrode 143 are to be formed, so that the electron supply layer 122 is exposed. Specifically, the resist pattern 181 is removed with an organic solvent, etc., and then a photoresist is applied again on the cap layer 123, and exposing and developing are performed by an exposing device. Accordingly, a resist pattern (not illustrated) is formed, having an opening part in the area where the source electrode 142 and the drain electrode 143 are to be formed. Subsequently, the cap layer 123 at the opening part of the resist pattern is removed by RIE, etc., so that the electron supply layer 122 is exposed in the area where the source electrode 142 and the drain electrode 143 are to be formed. Subsequently, the resist pattern (not illustrated) is removed by an organic solvent, etc.

Figure 20A:
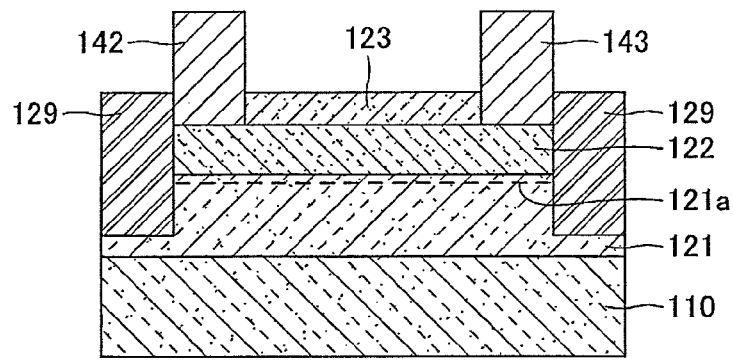
FIGS. 20A through 20C are process diagrams of a method of manufacturing a semiconductor device according to the fourth embodiment (2)

Next, as illustrated in FIG. 20A, the source electrode 142 and the drain electrode 143 are formed on the exposed electron supply layer 122. Specifically, a photoresist is applied again on the cap layer 123 and the electron supply layer 122, and exposing and developing are performed by an exposing device. Accordingly, a resist pattern (not illustrated) is formed, having an opening part in the area where the source electrode 142 and the drain electrode 143 are to be formed. Subsequently, by forming a metal film by vacuum deposition on the resist pattern and the electron supply layer 122 at the opening part, and dipping the metal film in an organic solvent, etc., the metal film formed on the resist pattern is removed by being lifted off together with the resist pattern. Accordingly, by the metal film remaining at the opening part of the resist pattern (not illustrated), the source electrode 142 and the drain electrode 143 are formed. At this time, the metal film that is formed is a metal laminated film of Ti/Al, which is made to have ohmic contact by subsequently performing a heat treatment at a temperature of approximately 700° C.

Figure 20B:
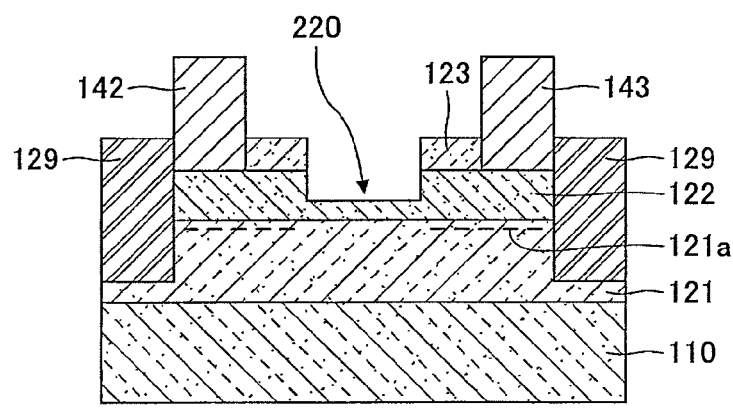

Next, as illustrated in FIG. 20B, the gate recess 220 is formed by removing part of the cap layer 123 and the electron supply layer 122 immediately below the area where the gate electrode 141 is to be formed. Specifically, a photoresist is applied on the cap layer 123, the source electrode 142, and the drain electrode 143, and exposing and developing are performed by an exposing device. Accordingly, a resist pattern (not illustrated) is formed, having an opening part in the area where the gate recess 220 is to be formed. Subsequently, part of the cap layer 123 and the electron supply layer 122 at the opening part of the resist pattern is removed by RIE, etc., so that the gate recess 220 is formed. The gate recess 220 formed in this case may be formed by removing the cap layer 123 and the electron supply layer 122 at the opening part of the resist pattern so that the electron transit layer 121 is exposed; furthermore, part of the electron transit layer 121 may also be removed. Subsequently, the resist pattern (not illustrated) is removed by an organic solvent, etc.

Figure 20C:
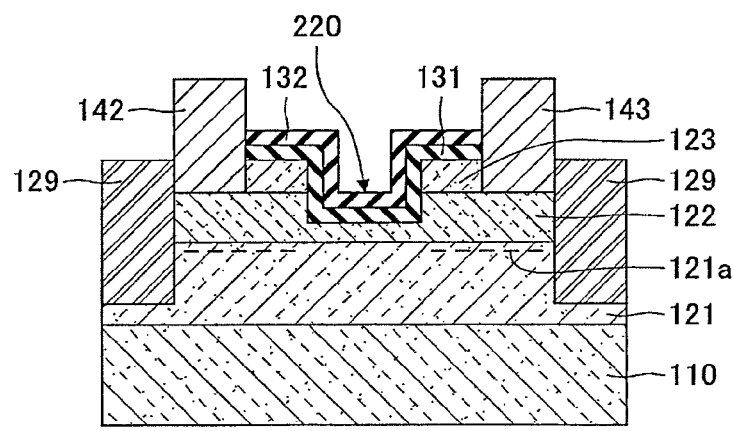

Next, as illustrated in FIG. 20C, on the side surface and the bottom surface of the gate recess 220 and on the cap layer 123, by performing ALD, the first insulating layer 131 and the second insulating layer 132 are laminated, which are constituted by $Al_2O_3$, etc. Specifically, on the electron supply layer 122 that is to be the bottom surface of the gate recess 220, on the side surface of the gate recess 220, and on the cap layer 123, the first insulating layer 131 and the second insulating layer 132 are formed of $Al_2O_3$ by performing ALD with the use of TMA and oxygen plasma. In the present embodiment, the first insulating layer 131 is formed under a substrate temperature condition of approximately 500° C. to have a thickness of approximately 20 nm, and the second insulating layer 132 is formed under a substrate temperature condition of approximately 350° C. to have a thickness of approximately 20 nm. Note that in order to form the first insulating layer 131 and the second insulating layer 132 in the area where the nitride semiconductor including the gate recess 220 is exposed, after forming the first insulating layer 131 and the second insulating layer 132, a photoresist is applied, and exposing and developing are performed by an exposing device. Accordingly, a resist pattern (not illustrated) is formed on the electron supply layer 122 where the gate recess 220 is formed and on the second insulating layer 132 on the cap layer 123. Subsequently, the first insulating layer 131 and the second insulating layer 132 are removed by RIE, etc., in the area where the resist pattern is not formed. Accordingly, the first insulating layer 131 and the second insulating layer 132 are formed on the electron supply layer 122 where the gate recess 220 is formed and on the cap layer 123. The resist pattern (not illustrated) is subsequently removed by an organic solvent, etc.

Figure 21:
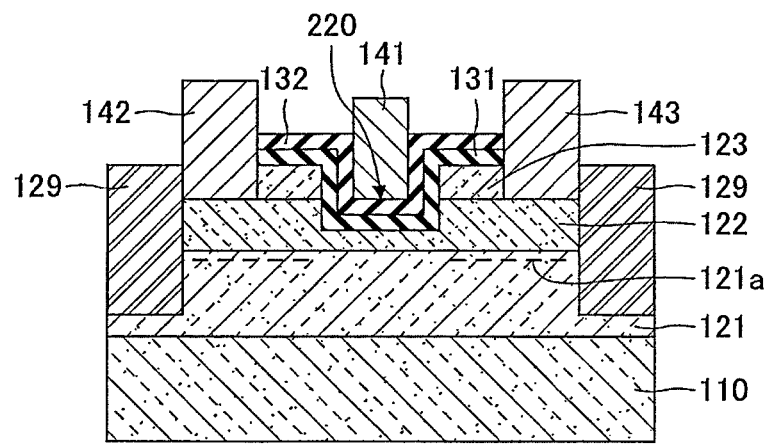
FIG. 21 is a process diagram of a method of manufacturing a semiconductor device according to the fourth embodiment (3)

Next, as illustrated in FIG. 21, the gate electrode 141 is formed on the second insulating layer 132 in the area where the gate recess 220 is formed. Specifically, on the second insulating layer 132, the source electrode 142, and the drain electrode 143, a photoresist is applied, and exposing and developing are performed by an exposing device, so that a resist pattern (not illustrated) is formed, which has an opening part in the area where the gate electrode 141 is to be formed. Subsequently, by forming a metal film by vacuum deposition on the resist pattern and the second insulating layer 132 at the opening part, and dipping the metal film in an organic solvent, etc., the metal film formed on the resist pattern is removed by being lifted off together with the resist pattern. Accordingly, by the metal film remaining at the opening part of the resist pattern (not illustrated), the gate electrode 141 is formed. At this time, the metal film that is formed is a metal laminated film of Ni/Au.

By the above manufacturing method, the semiconductor device according to the present embodiment is manufactured.

Note that the contents other than the above are the same as the first embodiment. Furthermore, in the present embodiment, instead of the first insulating layer 131 and the second insulating layer 132, the insulating layer 230 according to the second embodiment may be formed.

Fifth Embodiment

Figure 22:
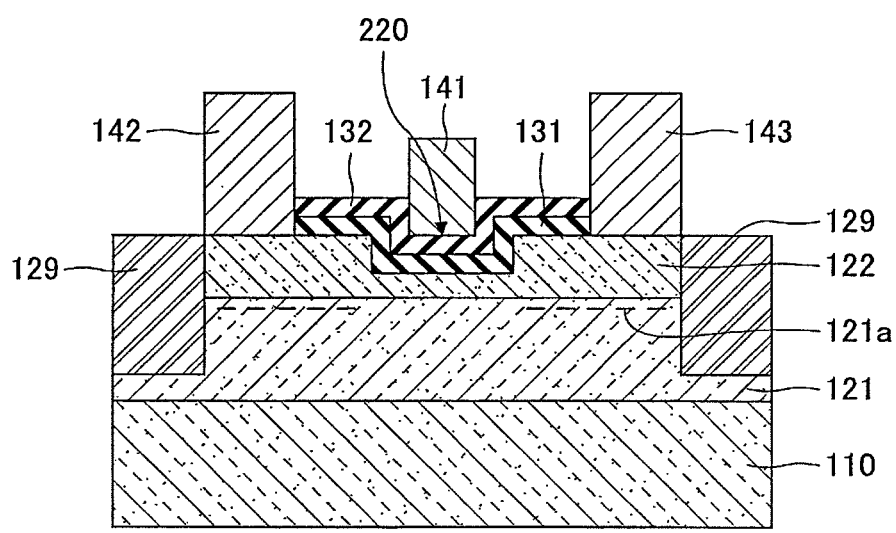
FIG. 22 is a structure diagram of a semiconductor device according to a fifth embodiment.

Next, a description is given of a semiconductor device according to a fifth embodiment, based on FIG. 22. The semiconductor device according to the present embodiment has an electron transit layer 121 and an electron supply layer 122 laminated on a substrate 110 and made of a nitride semiconductor. Furthermore, on part of the electron transit layer 121 and the electron supply layer 122, an element separation area 129 is formed for separating elements. Immediately below the area where the gate electrode 141 is to be formed, part of the electron supply layer 122 is removed, so that a gate recess 220 is formed, and on the electron supply layer 122, the source electrode 142 and the drain electrode 143 are formed. On the electron supply layer 122 including the area where the gate recess 220 is formed, the laminated first insulating layer 131 and second insulating layer 132 are formed, and on the second insulating layer 132, the gate electrode 141 is formed. Note that on the substrate 110, a buffer layer may be formed according to need, in which case the nitride semiconductor layers described above are formed on the buffer layer.

In the present embodiment, the electron transit layer 121 is formed of i-GaN having a thickness of 3 μm, and the electron supply layer 122 is formed of i-$Al_{0.25}Ga_{0.75}N$ having a thickness of 20 nm. Accordingly, at the part of the electron transit layer 121 near the interface between the electron transit layer 121 and the electron supply layer 122, 2DEG 121a is generated.

The gate recess 220 may be formed by removing the electron supply layer 122, or may be formed by removing part of the electron supply layer 122 and the electron transit layer 121.

The first insulating layer 131 and the second insulating layer 132 are both formed of $Al_2O_3$ by performing ALD with the use of TMA and oxygen plasma. The first insulating layer 131 preferably has a film thickness greater than or equal to 1 nm and less than or equal to 96 nm, and the second insulating layer 132 preferably has a film thickness greater than or equal to 4 nm and less than or equal to 99 nm. Furthermore, the sum of the film thicknesses of the first insulating layer 131 and the second insulating layer 132 is preferably greater than or equal to 5 nm and less than or equal to 100 nm. Note that in the present embodiment, the first insulating layer 131 is formed to have a film thickness of approximately 20 nm, and the second insulating layer 132 is formed to have a film thickness of approximately 20 nm.

In the present embodiment, by changing the film forming condition such as the substrate temperature, the insulating films are formed so that the number of —OH groups included in the first insulating layer 131 is less than the number of —OH groups included in the second insulating layer 132. Specifically, the substrate temperature when forming the first insulating layer 131 is set to be higher than the substrate temperature when forming the second insulating layer 132, and therefore the number of —OH groups included in the first insulating layer 131 is made to be less than the number of —OH groups included in the second insulating layer 132. In the present embodiment, when forming the first insulating layer 131, the substrate temperature is set to be greater than or equal to 400° C. and less than or equal to 550° C., for example, at approximately 500° C., and when forming the second insulating layer 132, the substrate temperature is set at approximately 350° C.

As described above, the first insulating layer 131 and the second insulating layer 132 are formed by being laminated on each other, so that the advantages of both layers are achieved, i.e., variations in the gate threshold voltage are decreased, and the gate leak current is reduced.

Furthermore, in the semiconductor device according to the present embodiment, by forming the gate recess 220, normally-off may be achieved.

Method of Manufacturing Semiconductor Device

Fifth Embodiment

Next, a description is given of a method of manufacturing the semiconductor device according to the present embodiment based on FIGS. 23A through 24C.

Figure 23A:
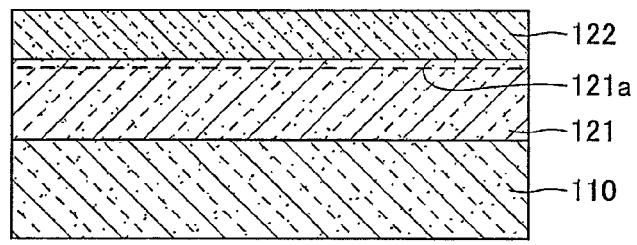
FIGS. 23A through 23C are process diagrams of a method of manufacturing a semiconductor device according to the fifth embodiment (1)

First, as illustrated in FIG. 23A, on the substrate 110, by MOVPE, a buffer layer (not illustrated), the electron transit layer 121 and the electron supply layer 122 are formed by being sequentially laminated. The electron transit layer 121 is formed of i-GaN having a thickness of 3 μm, and the electron supply layer 122 is formed of i-$Al_{0.25}Ga_{0.75}N$ having a thickness of 20 nm.

Figure 23B:
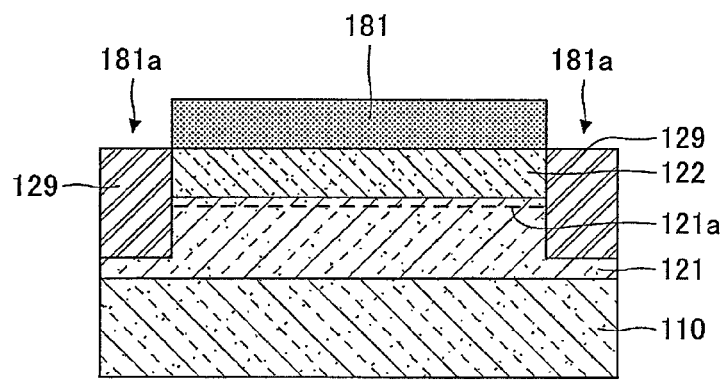

Next, as illustrated in FIG. 23B, the element separation area 129 is formed. Specifically, a photoresist is applied on the electron supply layer 122, and exposing and developing are performed by an exposing device, thereby forming a resist pattern 181 having an opening part 181a in an area where the element separation area 129 is to be formed. Subsequently, ions such as Ar are implanted in part of the electron supply layer 122 and the electron transit layer 121 at the opening part 181a of the resist pattern 181, to form the element separation area 129. Note that the element separation area 129 may be formed by removing part of the electron supply layer 122 and the electron transit layer 121 by dry etching using chlorinated gas.

Figure 23C:
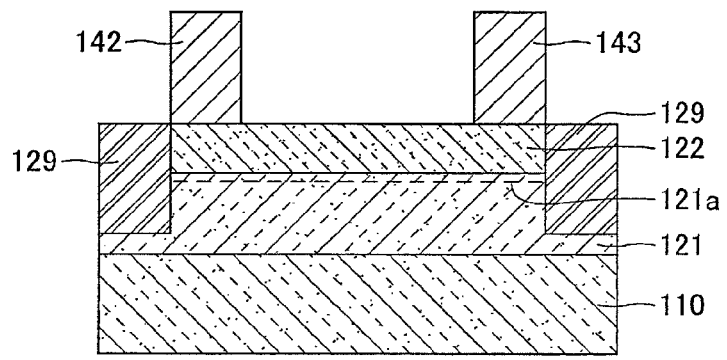

Next, as illustrated in FIG. 23C, the source electrode 142 and the drain electrode 143 are formed on the electron supply layer 122.

Specifically, a photoresist is applied on the electron supply layer 122, and exposing and developing are performed by an exposing device. Accordingly, a resist pattern (not illustrated) is formed, having an opening part in the area where the source electrode 142 and the drain electrode 143 are to be formed. Subsequently, by forming a metal film by vacuum deposition on the resist pattern and the electron supply layer 122 at the opening part, and dipping the metal film in an organic solvent, etc., the metal film formed on the resist pattern is removed by being lifted off together with the resist pattern. Accordingly, by the metal film remaining at the opening part of the resist pattern (not illustrated), the source electrode 142 and the drain electrode 143 are formed. At this time, the metal film that is formed is a metal laminated film of Ti/Al, which is made to have ohmic contact by subsequently performing a heat treatment at a temperature of approximately 700° C.

Figure 24A:
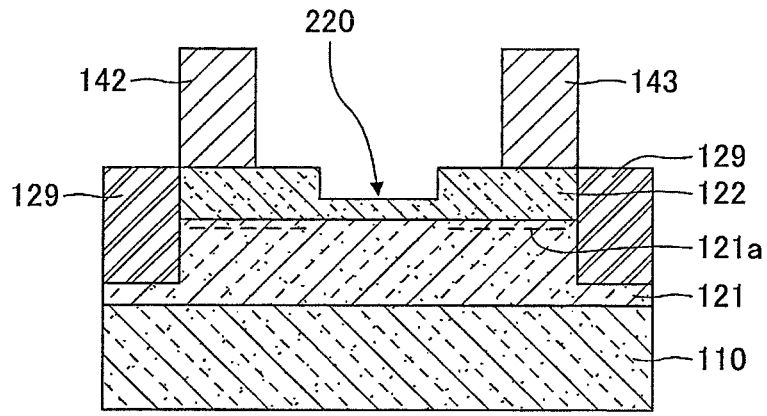
FIGS. 24A through 24C are process diagrams of a method of manufacturing a semiconductor device according to the fifth embodiment (2)

Next, as illustrated in FIG. 24A, the gate recess 220 is formed by removing part of the electron supply layer 122 in the area where the gate electrode 141 is to be formed. Specifically, a photoresist is applied on the electron supply layer 122, and exposing and developing are performed by an exposing device. Accordingly, a resist pattern (not illustrated) is formed, having an opening part in the area where the gate recess 220 is to be formed. Subsequently, part of the electron supply layer 122 at the opening part of the resist pattern is removed by RIE, etc., so that the gate recess 220 is formed. The gate recess 220 formed in this case may be formed by removing the electron supply layer 122 at the opening part of the resist pattern so that the electron transit layer 121 is exposed; furthermore, part of the electron transit layer 121 may also be removed. Subsequently, the resist pattern (not illustrated) is removed by an organic solvent, etc.

Figure 24B:
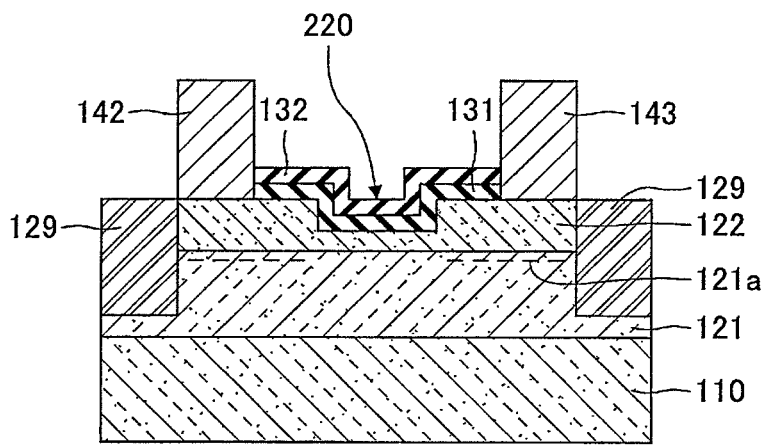

Next, as illustrated in FIG. 24B, on the electron supply layer 122 including the side surface and the bottom surface of the gate recess 220, by performing ALD, the first insulating layer 131 and the second insulating layer 132 are formed, which are constituted by $Al_2O_3$, etc. Specifically, on the electron supply layer 122 including the area where the gate recess 220 is formed, the first insulating layer 131 and the second insulating layer 132 are formed of $Al_2O_3$ by performing ALD with the use of TMA and oxygen plasma. In the present embodiment, the first insulating layer 131 is formed under a substrate temperature condition of approximately 500° C. to have a thickness of approximately 20 nm, and the second insulating layer 132 is formed under a substrate temperature condition of approximately 350° C. to have a thickness of approximately 20 nm. Note that in order to form the first insulating layer 131 and the second insulating layer 132 in the area where the electron supply layer 122 is exposed, after forming the first insulating layer 131 and the second insulating layer 132, a photoresist is applied, and exposing and developing are performed by an exposing device. Accordingly, a resist pattern (not illustrated) is formed on the second insulating layer 132 on the electron supply layer 122 including the area where the gate recess 220 is formed. Subsequently, the first insulating layer 131 and the second insulating layer 132 are removed by RIE, etc., in the area where the resist pattern is not formed. Accordingly, the first insulating layer 131 and the second insulating layer 132 are formed on the electron supply layer 122 including the area where the gate recess 220 is formed. The resist pattern (not illustrated) is subsequently removed by an organic solvent, etc.

Figure 24C:
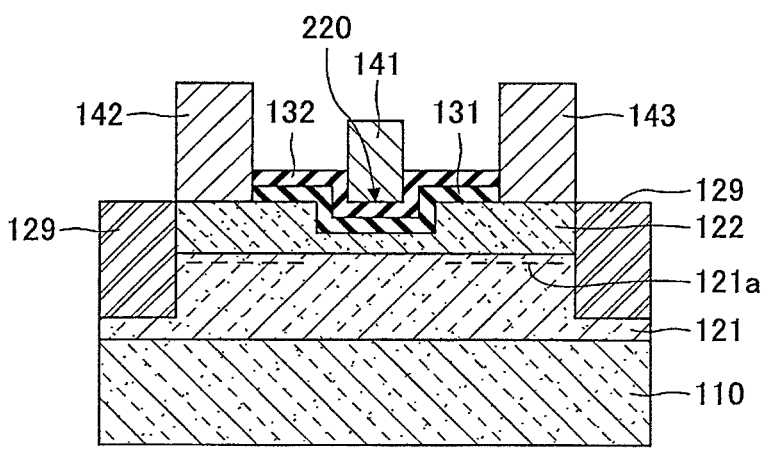

Next, as illustrated in FIG. 24C, the gate electrode 141 is formed on the second insulating layer 132 in the area where the gate recess 220 is formed. Specifically, on the second insulating layer 132, the source electrode 142, and the drain electrode 143, a photoresist is applied, and exposing and developing are performed by an exposing device, so that a resist pattern (not illustrated) is formed, which has an opening part in the area where the gate electrode 141 is to be formed. Subsequently, by forming a metal film by vacuum deposition on the resist pattern and the second insulating layer 132 at the opening part, and dipping the metal film in an organic solvent, etc., the metal film formed on the resist pattern is removed by being lifted off together with the resist pattern. Accordingly, by the metal film remaining at the opening part of the resist pattern (not illustrated), the gate electrode 141 is formed. At this time, the metal film that is formed is a metal laminated film of Ni/Au.

By the above manufacturing method, the semiconductor device according to the present embodiment is manufactured.

Note that the contents other than the above are the same as the first embodiment. Furthermore, in the present embodiment, instead of the first insulating layer 131 and the second insulating layer 132, the insulating layer 230 according to the second embodiment may be formed.

Sixth Embodiment

Figure 25:
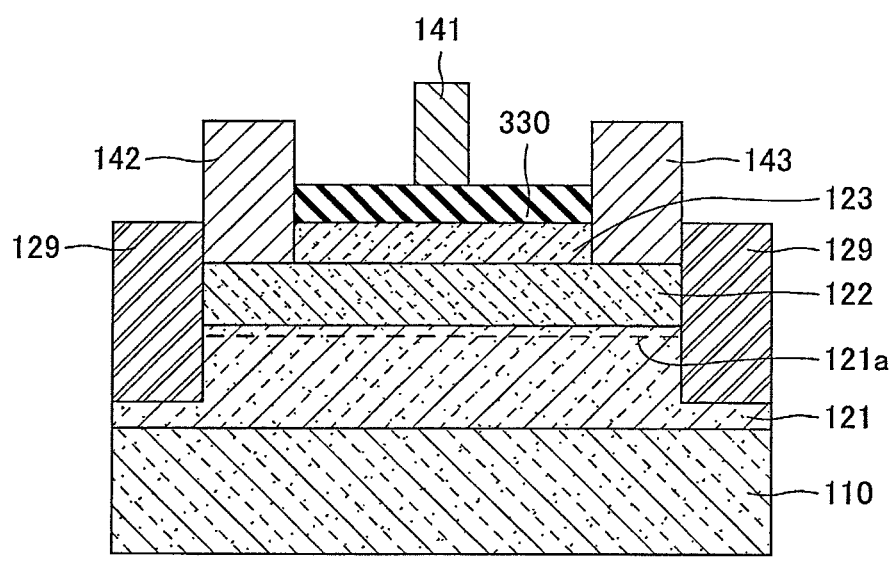
FIG. 25 is a structure diagram of a semiconductor device according to a sixth embodiment.

Next, a description is given of a semiconductor device according to a sixth embodiment, based on FIG. 25. The semiconductor device according to the present embodiment has an electron transit layer 121 and an electron supply layer 122 laminated on a substrate 110 and made of a nitride semiconductor. Furthermore, on part of the electron transit layer 121 and the electron supply layer 122, an element separation area 129 is formed for separating elements. On the electron supply layer 122, the source electrode 142, the drain electrode 143, and an insulating layer 330 are formed, and on the insulating layer 330, the gate electrode 141 is formed. Note that on the substrate 110, a buffer layer may be formed according to need, in which case the nitride semiconductor layers described above are formed on the buffer layer.

In the present embodiment, the electron transit layer 21 is formed of i-GaN having a thickness of 3 μm, and the electron supply layer 122 is formed of i-$Al_{0.25}Ga_{0.75}N$ having a thickness of 20 nm. Accordingly, at the part of the electron transit layer 121 near the interface between the electron transit layer 121 and the electron supply layer 122, 2DEG 121a is generated.

The insulating layer 330 is formed of $Al_2O_3$ by performing ALD with the use of TMA and oxygen plasma. The insulating layer 330 preferably has a film thickness greater than or equal to 40 nm and less than or equal to 100 nm, and is formed to have a film thickness of approximately 40 nm.

In the present embodiment, when forming the insulating layer 330, the substrate temperature is set to be greater than or equal to 400° C. and less than or equal to 550° C., for example, at approximately 500° C. Accordingly, variations in the gate threshold voltage are decreased. Furthermore, by increasing the thickness of the insulating layer 330, the gate leak current may be reduced.

Note that the contents other than the above are the same as the first embodiment. The present embodiment is also applicable to the semiconductor devices having the structures according to the third through fifth embodiments.

Seventh Embodiment

Next, a description is given of a seventh embodiment. The present embodiment is relevant to a semiconductor device, a power unit, and a high-frequency amplifier.

Semiconductor Device

Figure 26:
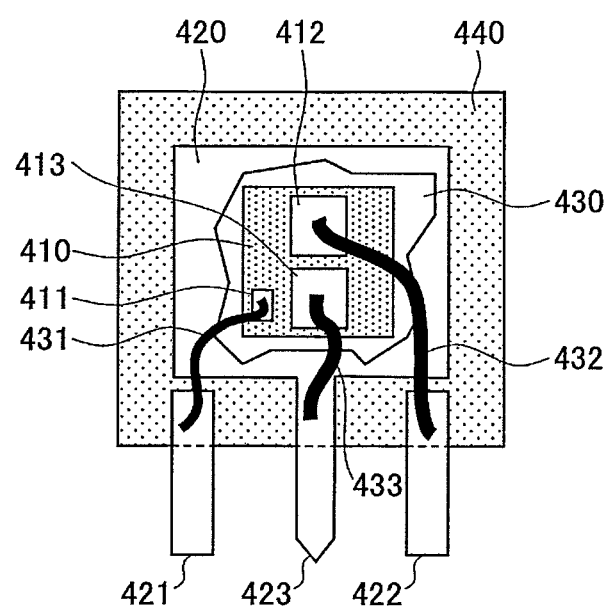
FIG. 26 is an explanatory diagram of a semiconductor device according to a seventh embodiment.

The semiconductor device according to the present embodiment is formed by discretely packaging the semiconductor device according to the first to sixth embodiments. A description is given of this discretely packaged semiconductor device based on FIG. 26. Note that FIG. 26 schematically illustrates the inside of the discretely packaged semiconductor device, and the locations of electrodes are different from those of the first to sixth embodiments.

First, the semiconductor device manufactured according to the first to sixth embodiments is cut by dicing, etc., and a semiconductor chip 410 that is a HEMT made of a GaN system material is formed. The semiconductor chip 410 is fixed on a lead frame 420 by a diatouch agent 430 such as solder. Note that the semiconductor chip 410 corresponds to the semiconductor device according to the first to sixth embodiments.

Next, the gate electrode 411 is connected to a gate lead 421 by a bonding wire 431, the source electrode 412 is connected to a source lead 422 by a bonding wire 432, and the drain electrode 413 is connected to a drain lead 423 by a bonding wire 433. Note that the bonding wires 431, 432, and 433 are formed of a metal material such as Al. Furthermore, in the present embodiment, the gate electrode 411 is one type of a gate electrode pad, which is connected to the gate electrode 141 of the semiconductor device according to the first through sixth embodiments. Furthermore, the source electrode 412 is one type of a source electrode pad, which is connected to the source electrode 142 of the semiconductor device according to the first through sixth embodiments. Furthermore, the drain electrode 413 is one type of a drain electrode pad, which is connected to the drain electrode 143 of the semiconductor device according to the first through sixth embodiments.

Next, resin sealing is performed with mold resin 440 by a transfer mold method. As described above, a discretely packaged semiconductor device of a HEMT made of a GaN system semiconductor material is manufactured.

PFC Circuit, Power Unit, and High-Frequency Amplifier

Next, a description is given of a PFC circuit, a power unit, and a high-frequency amplifier according to the present embodiment. The PFC circuit, the power unit, and the high-frequency amplifier according to the present embodiment are a power unit and a high-frequency amplifier using the semiconductor device according to any one of the first through sixth embodiments.

PFC Circuit

Next, a description is given of the PFC (Power Factor Correction) circuit according to the present embodiment. The PFC circuit according to the present embodiment includes the semiconductor device according to any one of the first through sixth embodiments.

Figure 27:
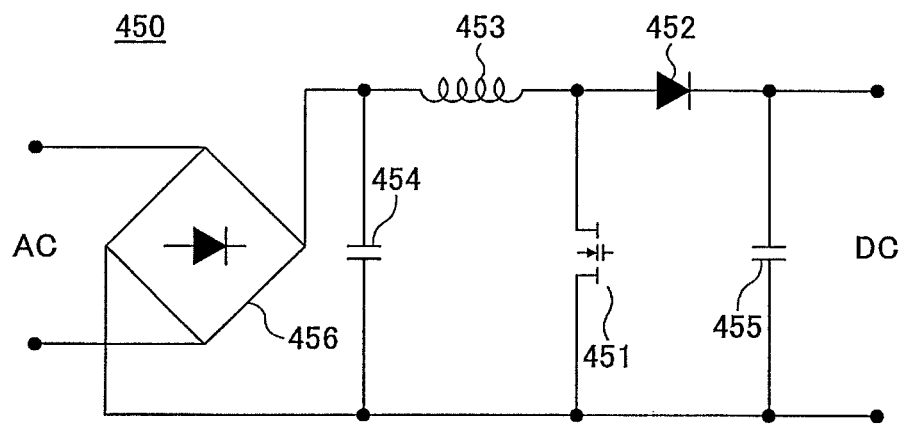
FIG. 27 is a circuit diagram of a PFC circuit according to the seventh embodiment.

A description is given of the PFC circuit according to the present embodiment, based on FIG. 27. A PFC circuit 450 according to the present embodiment includes a switch element (transistor) 451, a diode 452, a choke coil 453, capacitors 454, 455, a diode bridge 456, and an AC power supply (not illustrated). In the switch element 451, a HEMT that is the semiconductor device according to any one of the first through sixth embodiments is used.

In the PFC circuit 450, a drain electrode of the switch element 451 is connected with the anode terminal of the diode 452 and one of the terminals of the choke coil 453. Furthermore, a source electrode of the switch element 451 is connected with one of terminals of the capacitor 454 and one of the terminals of the capacitor 455, and the other one of terminals of the capacitor 454 is connected with the other one of terminals of the choke coil 453. The other one of the terminals of the capacitor 455 is connected with the cathode terminal of the diode 452, and between the two terminals of the capacitor 454, an AC power supply (not illustrated) is connected via the diode bridge 456. In the PFC circuit 450 as described above, between the two terminals of the capacitor 455, a direct current (DC) is output.

Power Unit

Next, a description is given of a power unit according to the present embodiment. The power unit according to the present embodiment is a power unit including a HEMT, which is the semiconductor device according to the first through sixth embodiments.

Figure 28:
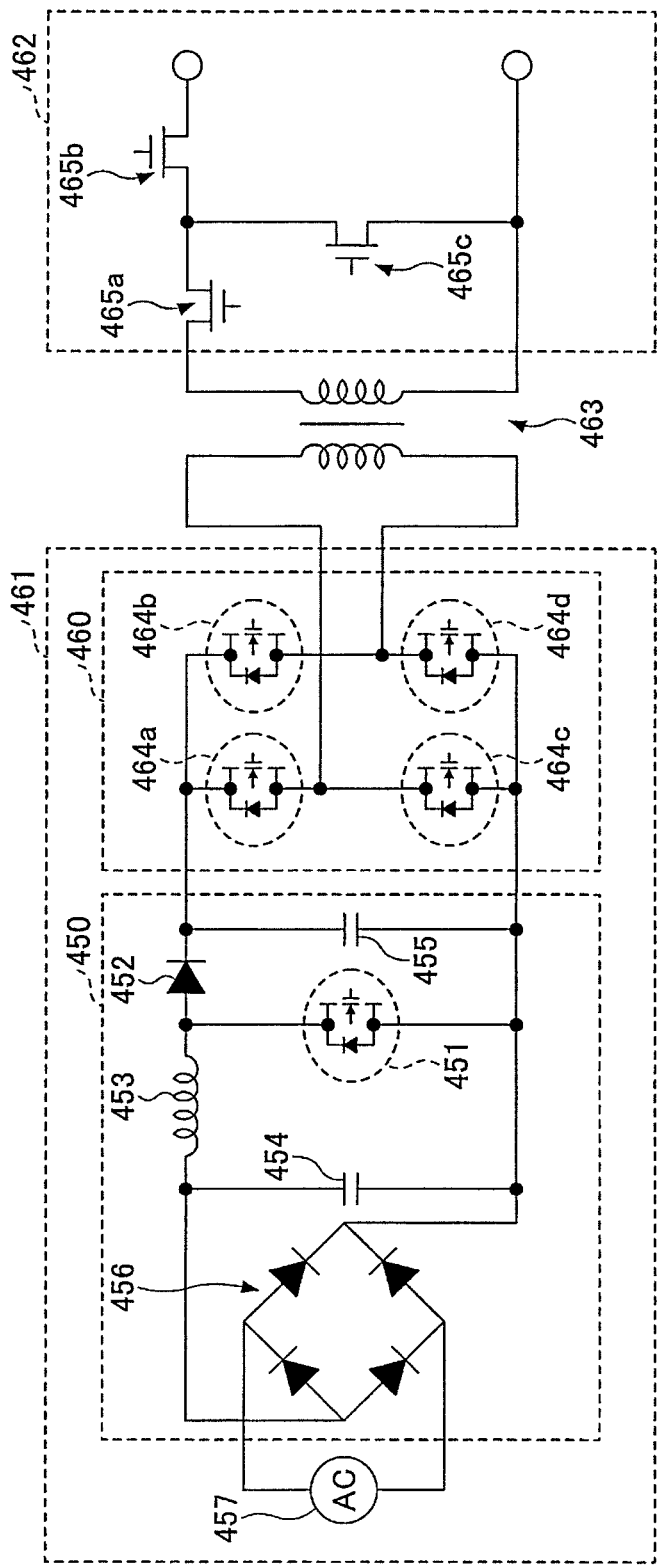
FIG. 28 is a circuit diagram of a power unit according to the seventh embodiment.

A description is given of the power unit according to the present embodiment, based on FIG. 28. The power unit according to the present embodiment has a structure including the PFC circuit 450 according to the present embodiment described above.

A power unit according to the present embodiment includes a high voltage primary side circuit 461, a low voltage secondary side circuit 462, and a transformer 463 disposed between the high voltage primary side circuit 461 and the low voltage secondary side circuit 462.

The high voltage primary side circuit 461 includes the PFC circuit 450 according to the present embodiment described above, an inverter circuit connected between the two terminals of the capacitor 455 of the PFC circuit 450, such as a full-bridge inverter circuit 460. The full-bridge inverter circuit 460 includes a plurality of (four in this case) switch elements 464a, 464b, 464c, and 464d. Furthermore, the secondary side circuit 462 includes a plurality of (three in this case) switch elements 465a, 465b, and 465c. Note that to the diode bridge 456, an AC power supply 457 is connected.

In the present embodiment, in the switch element 451 of the PFC circuit 450 in the primary side circuit 461, a HEMT that is the semiconductor device according to any one of the first through sixth embodiments is used. Furthermore, in the switch elements 464a, 464b, 464c, 464d of the full-bridge inverter circuit 460, a HEMT that is the semiconductor device according to the first or second embodiment is used. Meanwhile, in the switch elements 465a, 465b, 465c of the secondary side circuit 462, a FET having a regular MIS structure using silicon is used.

High-Frequency Amplifier

Next, a description is given of a high-frequency amplifier according to the present embodiment. The high-frequency amplifier according to the present embodiment has a structure using a HEMT that is a semiconductor device according to any one of the first through sixth embodiments.

Figure 29:
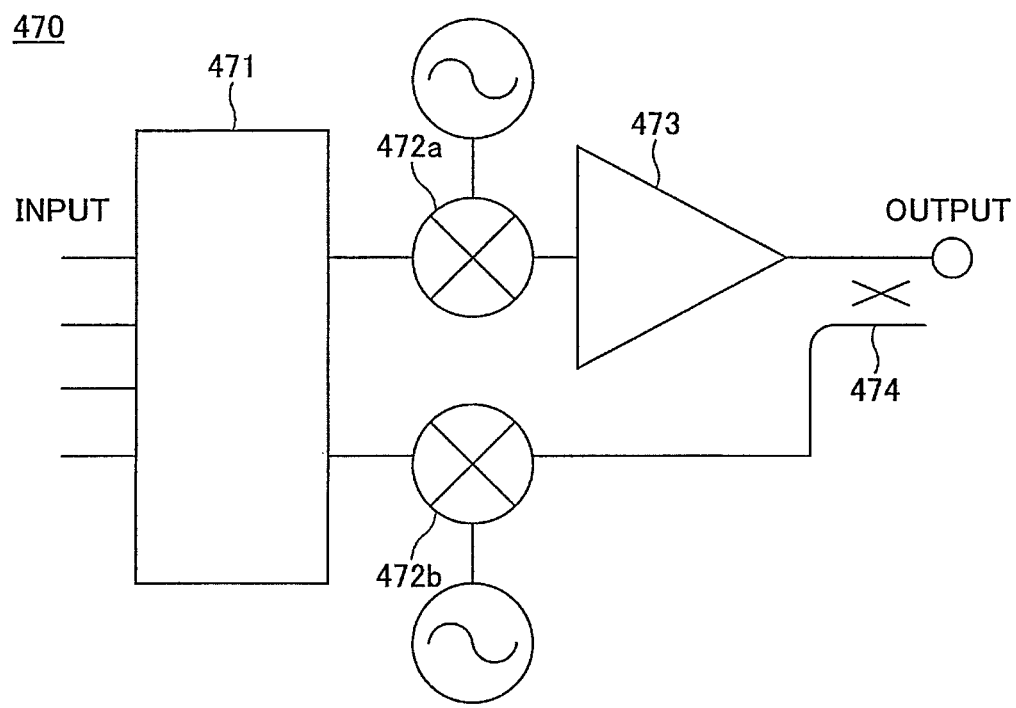
FIG. 29 is a structure diagram of a high-frequency amplifier according to the seventh embodiment.

A description is given of the high-frequency amplifier according to the present embodiment, based on FIG. 29. The high-frequency amplifier 470 according to the present embodiment includes a digital predistortion circuit 471, mixers 472a, 472b, a power amplifier 473, and a directional coupler 474.

The digital predistortion circuit 471 offsets the non-linear strains of input signals. The mixer 472a mixes the input signals, whose non-linear strains have been offset, with AC signals. The power amplifier 473 amplifies the input signals that have been mixed with the AC signals, and the power amplifier 473 includes a HEMT that is the semiconductor device according to the first through sixth embodiments. The directional coupler 474 monitors input signals and output signals. Note that in the circuit of FIG. 29, for example, the switch may be switched over so that signals of the output side are mixed with AC signals by the mixer 472b and sent to the digital predistortion circuit 471.

According to an aspect of the embodiments, a semiconductor device and a method of manufacturing the semiconductor device are provided, by which in a HEMT using a nitride semiconductor having a structure in which an insulting film is formed below a gate electrode, a gate threshold voltage is stable and the gate leak current is low.

The present invention is not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
a first semiconductor layer formed of a nitride semiconductor on a substrate;
a second semiconductor layer formed of a nitride semiconductor on the first semiconductor layer;

an insulating layer formed of a material including an oxide and formed on the second semiconductor layer by laminating a first insulating layer and a second insulating layer in a positioning order of the first insulating layer followed by the second insulating layer from a side of the second semiconductor layer, in which an amount of hydroxyl groups included in per unit volume of the first insulating layer is less than an amount of hydroxyl groups included in per unit volume of the second insulating layer, and is an amount in which an average of hysteresis widths in a C-V property is less than or equal to 0.4 V;

a source electrode and a drain electrode formed on the second semiconductor layer; and a gate electrode formed on the second insulating layer.

2. A semiconductor device, comprising:

a first semiconductor layer formed of a nitride semiconductor on a substrate;

a second semiconductor layer formed of a nitride semiconductor on the first semiconductor layer;

an insulating layer formed of a material including an oxide and formed on the second semiconductor layer, in which an amount of hydroxyl groups included in per unit volume is an amount in which an average of hysteresis widths in a C-V property is less than or equal to 0.4 V, and is increased from a side on the second semiconductor layer toward a surface of the insulating layer;

a source electrode and a drain electrode formed on the second semiconductor layer; and a gate electrode formed on the surface of the insulating layer.

3. The semiconductor device according to claim 1, wherein the insulating layer is formed by atomic layer deposition with the use of plasma including oxygen, and a substrate temperature when forming the first insulating layer is higher than a substrate temperature when forming the second insulating layer.

4. The semiconductor device according to claim 3, wherein the substrate temperature when forming the first insulating layer is greater than or equal to 400° C. and less than or equal to 550° C.

5. A semiconductor device, comprising:

a first semiconductor layer formed of a nitride semiconductor on a substrate;

a second semiconductor layer formed of a nitride semiconductor on the first semiconductor layer;

an insulating layer formed of a material including an oxide by atomic layer deposition with the use of plasma including oxygen and formed on the second semiconductor layer by laminating a first insulating layer and a second insulating layer in a positioning order of the first insulating layer followed by the second insulating layer from a side of the second semiconductor layer and formed, in which the first insulating layer is formed at a substrate temperature of greater than or equal to 400° C. and less than or equal to 550° C. so that an amount of hydroxyl groups is decreased until an average of hysteresis widths in a C-V property is less than or equal to 0.4 V and the second insulating layer is formed at the substrate temperature lower than the first insulating layer;

a source electrode and a drain electrode formed on the second semiconductor layer; and a gate electrode formed on the second insulating layer.

6. The semiconductor device according to claim 1, wherein the insulating layer is formed of a material including any one of aluminum oxide, hafnium oxide, and silicon oxide.

7. The semiconductor device according to claim 1, further comprising:

a third semiconductor layer formed of a nitride semiconductor on the second semiconductor layer, wherein the insulating layer is formed on the third semiconductor layer.

8. The semiconductor device according to claim 1, further comprising:

a gate recess formed by removing the second semiconductor layer in an area where the gate electrode is to be formed.

9. The semiconductor device according to claim 1, further comprising:

a third semiconductor layer formed of a nitride semiconductor on the second semiconductor layer; and a gate recess formed by removing the third semiconductor layer and the second semiconductor layer in an area where the gate electrode is to be formed, wherein the insulating layer is formed on the gate recess and the third semiconductor layer.

10. The semiconductor device according to claim 7, wherein the third semiconductor layer is formed of a material including GaN.

11. The semiconductor device according to claim 1, wherein the first semiconductor layer is formed of a material including GaN.

12. The semiconductor device according to claim 1, wherein the second semiconductor layer is formed of a material including any one of AlGaN, InGaAlN, and InAlN.

13. A method for manufacturing a semiconductor device, the method comprising:

forming sequentially on a substrate, a first semiconductor layer and a second semiconductor layer of a nitride semiconductor;

forming, on the second semiconductor layer, a first insulating layer by atomic layer deposition with the use of oxygen plasma, in which a substrate temperature when forming the first insulating layer is a temperature at which an amount of hydroxyl groups becomes an amount in which an average of hysteresis widths in a C-V property is less than or equal to 0.4 V, and is higher than a substrate temperature when forming a second insulating layer;

forming, on the first insulating layer, the second insulating layer by atomic layer deposition with the use of oxygen plasma;

forming a gate electrode on the second insulating layer; and forming a source electrode and a drain electrode on the second semiconductor layer.

14. The method according to claim 13, wherein the substrate temperature when forming the first insulating layer is greater than or equal to 400° C. and less than or equal to 550° C.

15. The method according to claim 13, wherein the first insulating layer and the second insulating layer are formed of a material including any one of aluminum oxide, hafnium oxide, and silicon oxide.

16. A method for manufacturing a semiconductor device, the method comprising:

forming sequentially on a substrate, a first semiconductor layer and a second semiconductor layer of a nitride semiconductor;

forming, on the second semiconductor layer, an insulating layer by atomic layer deposition with the use of oxygen plasma, by forming a surface side of the insulating layer at a substrate temperature which is lower than a substrate temperature when forming a side on the second semiconductor layer and at which an amount of hydroxyl groups becomes an amount in which an average of hysteresis widths in a C-V property is less than or equal to 0.4 V;

forming a gate electrode on the surface side of the insulating layer; and forming a source electrode and a drain electrode on the second semiconductor layer.

17. A method for manufacturing a semiconductor device, the method comprising:

forming sequentially on a substrate, a first semiconductor layer and a second semiconductor layer of a nitride semiconductor;

forming, on the second semiconductor layer, an insulating layer of a material including an oxide by atomic layer deposition with the use of oxygen plasma including oxygen and by laminating a first insulating layer and a second insulating layer in a positioning order of the first insulating layer followed by the second insulating layer from a side of the second semiconductor layer, in which the first insulating layer is formed at a substrate temperature of greater than or equal to 400° C. and less than or equal to 550° C. so that an amount of hydroxyl groups is decreased until an average of hysteresis widths in a C-V property is less than or equal to 0.4 V and the second insulating layer is formed at the substrate temperature lower than the first insulating layer;

forming a gate electrode on the second insulating layer; and forming a source electrode and a drain electrode on the second semiconductor layer.

18. The method according to claim 16, wherein the insulating layer is formed of a material including any one of aluminum oxide, hafnium oxide, and silicon oxide.

19. A power unit comprising:

the semiconductor device according to claim 1.

20. An amplifier comprising:

the semiconductor device according to claim 1.

* * * * *